United States Patent
Quinones et al.

(10) Patent No.: US 11,616,006 B2
(45) Date of Patent: Mar. 28, 2023

(54) SEMICONDUCTOR PACKAGE WITH HEATSINK

(71) Applicant: SEMICONDUCTOR COMPONENTS INDUSTRIES, LLC, Phoenix, AZ (US)

(72) Inventors: Maria Clemens Ypil Quinones, Cebu (PH); Elsie Agdon Cabahug, Consolacion (PH); Jerome Teysseyre, Scottsdale, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 680 days.

(21) Appl. No.: 16/506,405

(22) Filed: Jul. 9, 2019

(65) Prior Publication Data

US 2020/0273782 A1 Aug. 27, 2020

Related U.S. Application Data

(60) Provisional application No. 62/811,147, filed on Feb. 27, 2019.

(51) Int. Cl.
*H01L 23/495* (2006.01)
*H01L 23/31* (2006.01)

(52) U.S. Cl.
CPC .... *H01L 23/49568* (2013.01); *H01L 23/3114* (2013.01); *H01L 23/4951* (2013.01); *H01L 23/49555* (2013.01); *H01L 23/49575* (2013.01)

(58) Field of Classification Search
CPC ........... H01L 23/49568; H01L 23/3114; H01L 23/4951; H01L 23/49555; H01L 23/49575; H01L 23/3107; H01L 2224/16245; H01L 23/4334; H01L 23/49541; H01L 23/49551; H01L 23/49589; H01L 23/49531; H01L 23/367; H01L 23/3157; H01L 23/3675
USPC ......................................................... 257/673
See application file for complete search history.

(56) References Cited

U.S. PATENT DOCUMENTS

| | | | |
|---|---|---|---|
| 9,735,112 B2 * | 8/2017 | Constantino | H01L 23/49575 |
| 10,049,954 B2 * | 8/2018 | Bang | H01L 21/6835 |
| 2006/0151868 A1 | 7/2006 | Zhu et al. | |
| 2010/0001790 A1 * | 1/2010 | Hashimoto | H02M 7/003 327/566 |
| 2018/0323170 A1 * | 11/2018 | Kim | H01L 23/3128 |

FOREIGN PATENT DOCUMENTS

DE   102014117086 A1   5/2015

OTHER PUBLICATIONS

Zhengyang Liu et al., "Evalulation of High-Voltage Cascode GaN HEMT in Different Packages," Mar. 2014.

\* cited by examiner

*Primary Examiner* — Caleb E Henry
*Assistant Examiner* — Dilinh P Nguyen
(74) *Attorney, Agent, or Firm* — Brake Hughes Bellermann LLP

(57) ABSTRACT

According to an aspect, a semiconductor package includes a substrate having a first surface and a second surface opposite to the first surface, a semiconductor die coupled to the second surface of the substrate, and a molding encapsulating the semiconductor die and a majority of the substrate, where at least a portion of the first surface is exposed through the molding such that the substrate is configured to function as a heat sink.

18 Claims, 16 Drawing Sheets

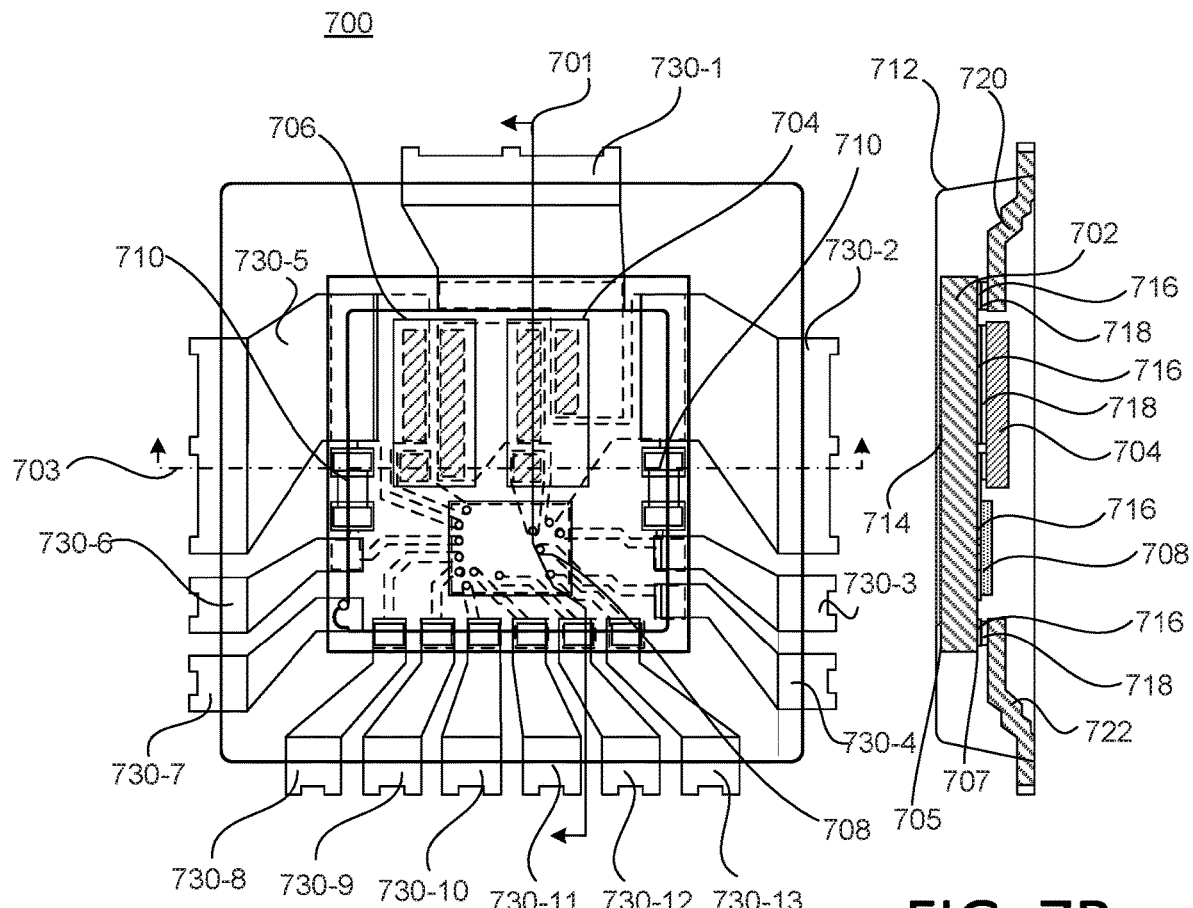
FIG. 7A
FIG. 7B
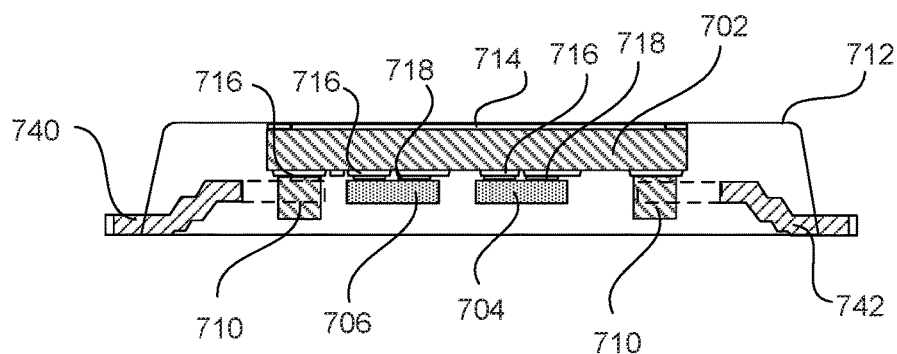
FIG. 7C

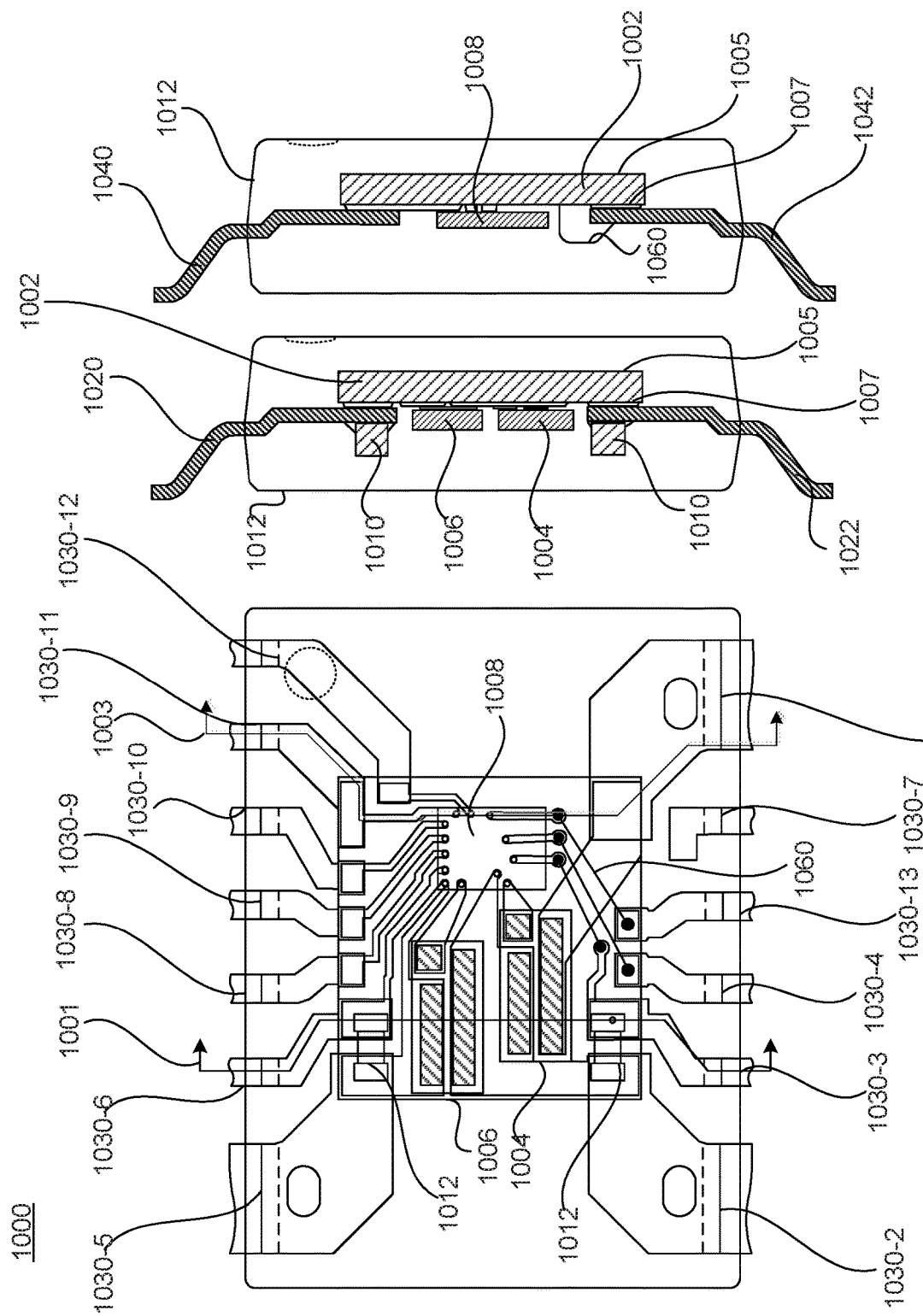

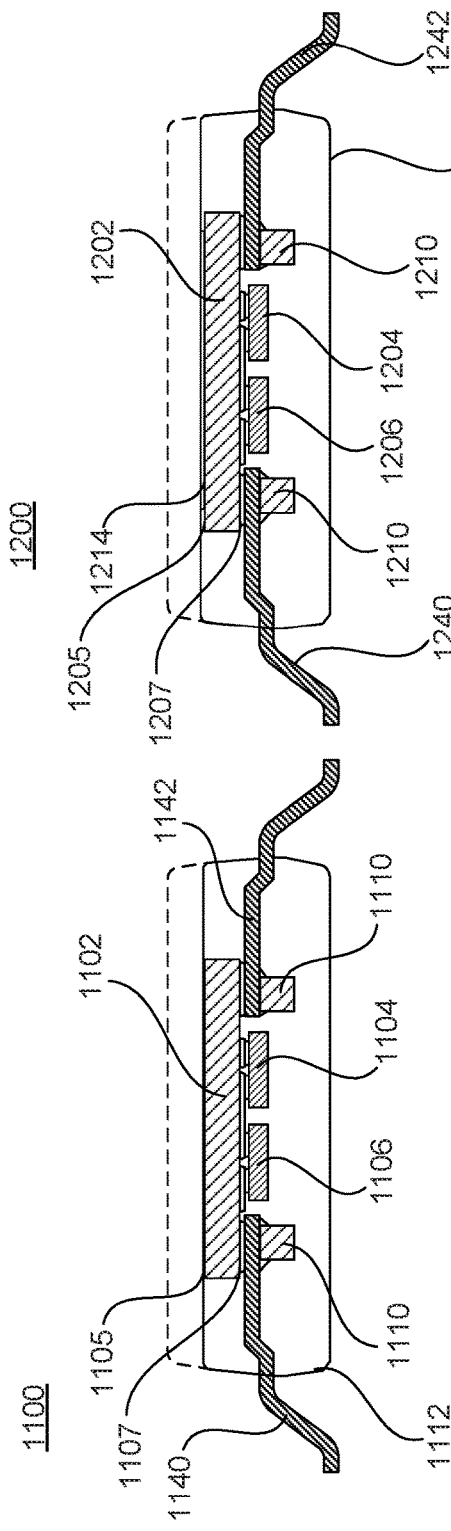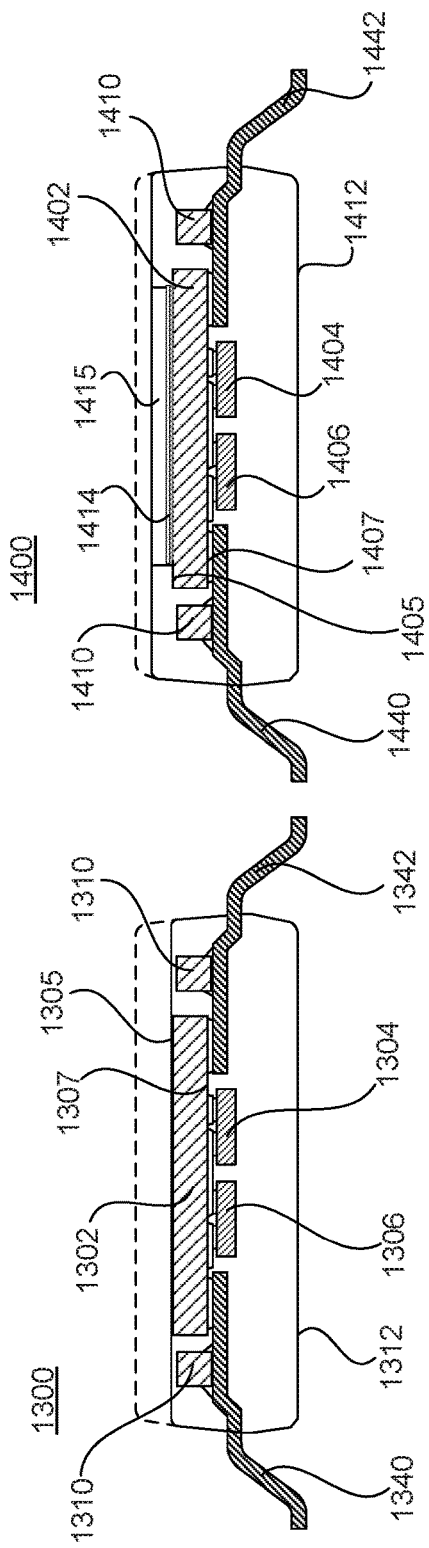

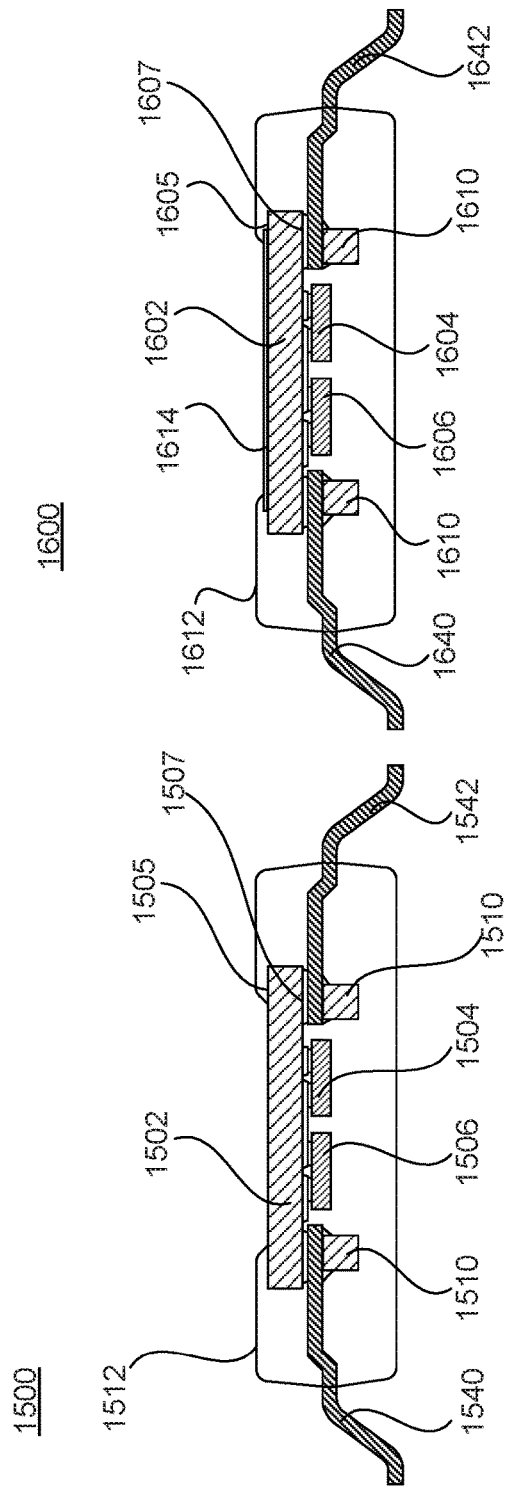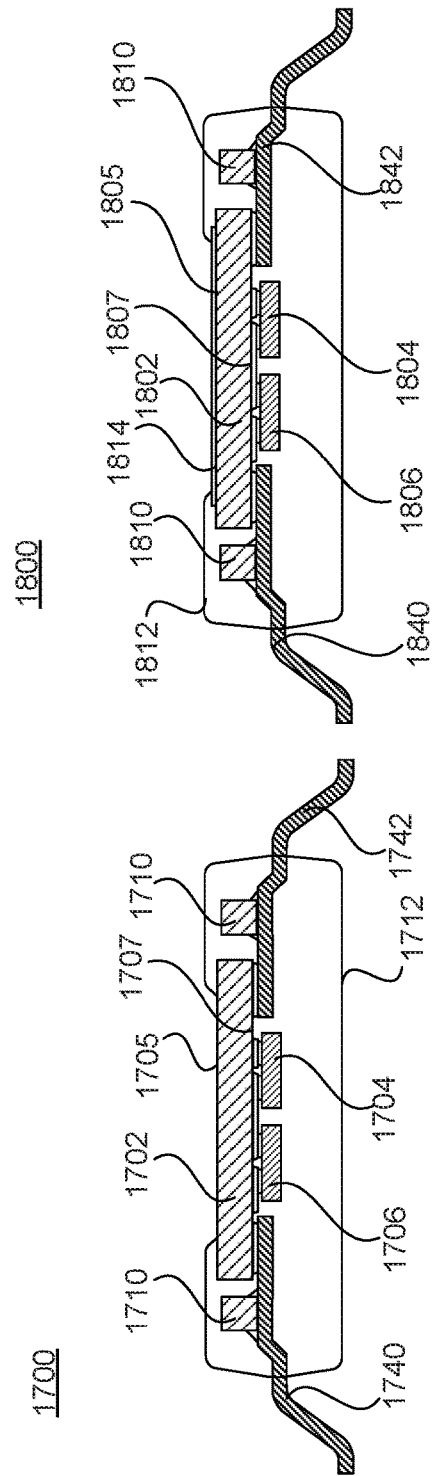

SEMICONDUCTOR PACKAGE WITH HEATSINK

CROSS-REFERENCE TO RELATED APPLICATIONS

This application claims the benefit of U.S. Provisional Patent Application No. 62/811,147, filed on Feb. 27, 2019, the entire contents of which is incorporated herein by reference.

TECHNICAL FIELD

This description relates to a semiconductor package with a heatsink.

BACKGROUND

Conventional semiconductor packages may use relatively long wires to connect between various devices in the package. These conventional semiconductor packages may suffer from relatively high resistance and inductance losses, and the heat generated in these wires may be relatively high.

SUMMARY

According to an aspect, a semiconductor package includes a substrate having a first surface and a second surface opposite to the first surface, a semiconductor die coupled to the second surface of the substrate, and a molding encapsulating the semiconductor die and a majority of the substrate, where at least a portion of the first surface is exposed through the molding such that the substrate is configured to function as a heat sink.

According to some aspects, the semiconductor package includes one or more of the following features (or any combination thereof). The semiconductor package may include a metal trace coupled to the first surface of the substrate, and at least a portion of the metal trace is exposed through the molding. The substrate may include a via extending between the first surface and the second surface. The semiconductor package may include a first leadframe portion coupled to the second surface of the substrate, and a second leadframe portion coupled to the second surface of the substrate, where the semiconductor die is disposed between the first leadframe portion and the second leadframe portion. In some examples, the semiconductor die is a first semiconductor die, and the semiconductor package further includes a second semiconductor die coupled to the second surface of the substrate, and a third semiconductor die coupled to the second surface of the substrate. The semiconductor package may include a first metal trace coupled to the second surface of the substrate, and a second metal trace coupled to the first metal trace, where the semiconductor die is coupled to the second metal trace. The semiconductor package may include a passive device coupled to the substrate, and a metal trace coupled to the second surface of the substrate, where the passive device is coupled to the metal trace. The semiconductor package may include a leadframe portion coupled to the substrate, and a passive device coupled to the leadframe portion.

According to an aspect, a semiconductor package includes a substrate having a first surface and a second surface opposite to the first surface, a leadframe portion coupled to the substrate, a first metal trace coupled to the first surface of the substrate, at least one second metal trace coupled to the second surface of the substrate, a semiconductor die coupled to the at least one second metal trace, and a molding encapsulating the semiconductor die and a majority of the substrate, where at least a portion of the first metal trace is exposed through the molding such that the substrate is configured to function as a heat sink.

According to some aspects, the semiconductor package may include one or more of the above/below features (or any combination thereof). The substrate includes a via connecting the leadframe portion to the first metal trace. The at least one second metal trace may include two stacked metal traces. The semiconductor package may include a capacitor coupled to the leadframe portion or the substrate. The semiconductor die may be a first semiconductor die, the semiconductor package further includes a second semiconductor die coupled to the at least one second metal trace, and a third semiconductor die coupled to the at least one second metal trace. The first semiconductor die may be a low-side semiconductor die, the second semiconductor die may be a high-side semiconductor die, and the third semiconductor die may be a driver integrated circuit (IC) die.

According to an aspect, a semiconductor package includes a substrate having a first surface and a second surface opposite to the first surface, and the substrate has a via extending between the first surface and the second surface. The semiconductor package includes a leadframe portion coupled to the second surface of the substrate, a metal trace coupled to the first surface of the substrate, where the via connects the metal trace to the leadframe portion, a high-side semiconductor die coupled to the second surface of the substrate, a low-side semiconductor die coupled to the second surface of the substrate, and a molding encapsulating the semiconductor die and a majority of the substrate, where at least a portion of the metal trace is exposed through the molding such that the substrate is configured to function as a heat sink.

According to some aspects, the semiconductor package includes one or more of the above/below features (or any combination thereof). The semiconductor package may include a first passive device coupled to the substrate, and a second passive device coupled to the substrate. The semiconductor package may include a driver integrated circuit (IC) die coupled to the second surface of the substrate. The high-side semiconductor die and the low-side semiconductor die may be coupled to the second surface of the substrate via a second metal trace and a third metal trace, and the driver IC die may be coupled to the second surface of the substrate via the second metal trace but not the third metal trace.

The details of one or more implementations are set forth in the accompanying drawings and the description below. Other features will be apparent from the description and drawings, and from the claims.

BRIEF DESCRIPTION OF THE DRAWINGS

FIGS. 7A through 7C illustrate a semiconductor package according to another aspect.

FIGS. 10A through 10C illustrate a semiconductor package according to another aspect.

FIG. 11 illustrates a semiconductor package according to another aspect.

FIG. 12 illustrates a semiconductor package according to another aspect.

FIG. 13 illustrates a semiconductor package according to another aspect.

FIG. 14 illustrates a semiconductor package according to another aspect.

FIG. 15 illustrates a semiconductor package according to another aspect.

FIG. 16 illustrates a semiconductor package according to another aspect.

FIG. 17 illustrates a semiconductor package according to another aspect.

FIG. 18 illustrates a semiconductor package according to another aspect.

DETAILED DESCRIPTION

The present disclosure relates to a semiconductor package having a substrate (e.g., a ceramic substrate) in which a portion of the substrate's surface is exposed through a molding such that the substrate functions as a heat sink for one or more of the package's heat-generating (e.g., active) components. The substrate includes a first surface and a second surface, and one or more semiconductor dice are coupled to the second surface of the substrate via one or more redistribution layers (e.g., metal traces). In some examples, a redistribution layer is coupled to the first surface of the substrate, and at least a portion of the redistribution layer on the first surface is exposed through the molding. In some examples, the redistribution layer on the first surface is solder plated. The semiconductor package discussed herein may reduce the resistance and inductance of the interconnectors for at least some of the package's components, and may provide an exit path for heat that is generated when the semiconductor package is activated.

Figure 1:
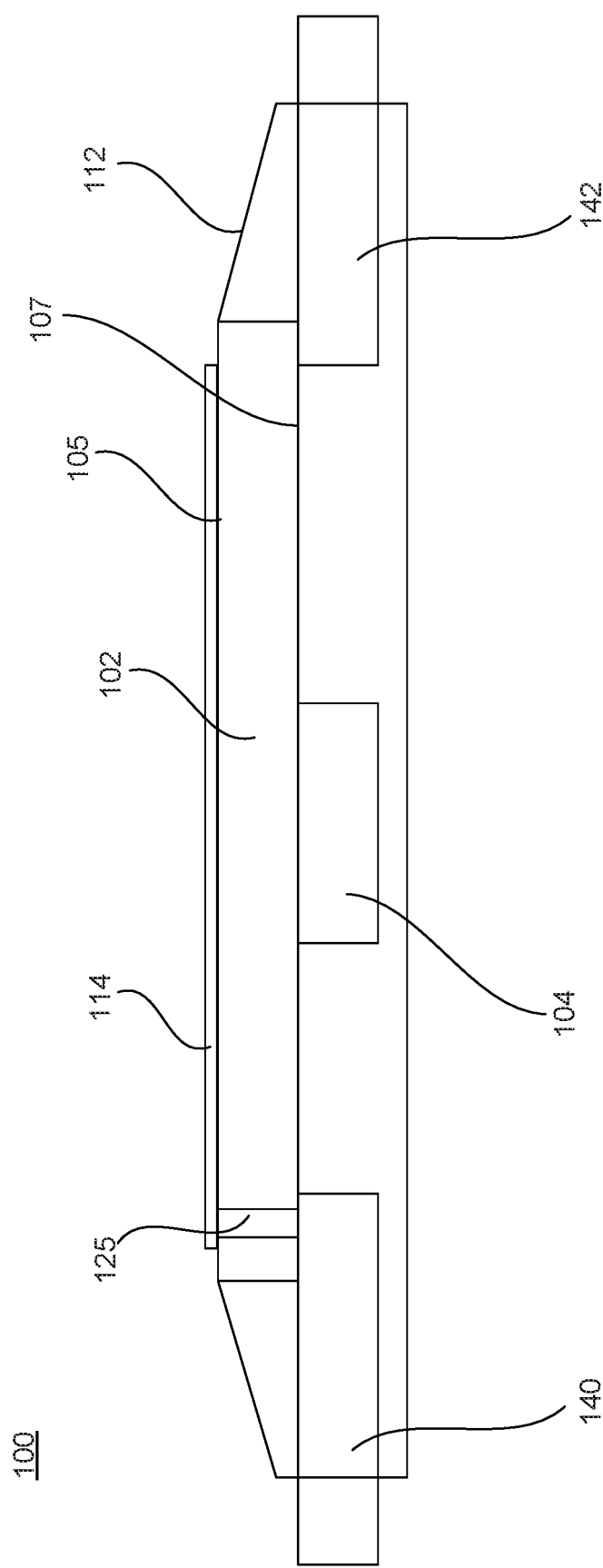
FIG. 1 illustrates a semiconductor package according to an aspect.

FIG. 1 illustrates a semiconductor package 100 according to an aspect. The semiconductor package 100 may reduce the resistance and inductance of the interconnectors for at least some of the package's components, and may provide an exit path for heat that is generated when the semiconductor package 100 is activated.

For example, the semiconductor package 100 includes a substrate 102 configured to function as a heatsink by exposing at least a portion of the substrate 102 through a molding 112. In some examples, the substrate 102 includes a ceramic interposer, and the ceramic interposer is configured to operate as a heat dissipative material. In some examples, when a portion of the substrate 102 is exposed through the molding 112, a heat dissipation path may be created through the substrate 102 that allows the release of heat generated by heat-generating components that are coupled to the substrate 102. In some examples, the dielectric material of a first surface 105 of the substrate 102 is exposed through the molding 112 on the package exterior. In some examples, a metal trace 114 (e.g., a redistribution layer) is coupled to the first surface 105 of the substrate 102, and at least a portion of the metal trace 114 is exposed through the molding 112 on the package exterior. In some examples, the exposure of the metal trace 114 through the molding 112 may allow the substrate 102 to function as the heat sink in order to release heat from the semiconductor package 100. In some examples, the exposure of the metal trace 114 through the molding 112 in conjunction with a via 125 that extends through the substrate 102 may allows the substrate 102 to function as the heat sink in order to release heat from the semiconductor package 100. In some examples, the connection of the via 125 to a leadframe portion 140 (which is thereby connected to one or more heat-generating components via one or more redistribution layers) may allow the substrate 102 to function as the heat sink in order to release heat from the semiconductor package 100.

In some examples, the metal trace 114 is solder plated. For example, during the lead finishing process, solder plating may be deposited on the metal trace 114. In some examples, the solderable exposed metal trace 114 is configured to be connected to another heatsink. In some examples, the first surface 105 of the substrate 102 or the metal trace 114 is exposed by grinding down the molding 112 in order to expose the metal trace 114 or the first surface 105 of the substrate 102. In some examples, a recess is formed in the molding 112 in order to expose at least a portion of the first surface 105 or the metal trace 114.

The molding 112 encapsulates at least a majority (e.g., greater than 50%, greater than 75%, greater than 85%, or greater than 90%) of the components of the semiconductor package 100 in terms of surface area of components covered by the molding 112 versus surface area of components not covered by the molding 112. In some examples, the molding 112 encapsulates all of the components of the semiconductor package 100 except for a portion of the substrate 102 (and the leads that extend from the molding 112). In some examples, the molding 112 includes an inorganic material. In some examples, the molding 112 includes an organic material. In some examples, the molding 112 includes a combination of one or more organic materials and/or one or more inorganic materials. In some examples, the molding 112 includes an epoxy material formed from epoxy resins. In some examples, the molding 112 includes a gel material (e.g., silicone gel).

The semiconductor package 100 includes a semiconductor die 104 coupled to a second surface 107 of the substrate 102. In some examples, the semiconductor die 104 is coupled to the second surface 107 via one or more redistribution layers (e.g., one metal trace or two or more metal traces). In some examples, the semiconductor die 104 is coupled (e.g., soldered) to a redistribution layer disposed on the second surface 107 via one or more conductive components (e.g., pillars, bumps, etc.). In some examples, the semiconductor die 104 is coupled to the substrate 102 in a flip-chip configuration. In some examples, the semiconductor die 104 includes a transistor (e.g., bipolar junction transistor, field-effect transistor, a metal-oxide-semiconductor field-effect transistor (MOSFET)). In some examples, the semiconductor die 104 includes one or more integrated circuits (ICs). In some examples, the semiconductor die 104 includes a field-effect transistor (FET). In some examples, the semiconductor die 104 includes a gallium nitride (GaN) low-side or high-side semiconductor die. In some examples, the semiconductor die 104 includes a driver IC die. In some examples, multiple semiconductor dice are coupled to the second surface 107 of the substrate.

The semiconductor package 100 includes a leadframe portion 140 and a leadframe portion 142. The leadframe portion 140 and the leadframe portion 142 are coupled to the second surface 107 of the substrate 102. In some examples, the leadframe portion 140 and the leadframe portion 142 are coupled to the second surface 107 of the substrate via one or more redistribution layers.

In some examples, the substrate includes the via 125 that extends through the substrate 102. In some examples, the substrate includes multiple vias 125. In some examples, the via 125 is a hole with metal filling. In some examples, the via 125 is a copper-filled hole that enables the metal trace 114 to be solder plated. In some examples, the via 125 is coupled to the leadframe portion 140. The via 125 may connect the metal trace 114 to the leadframe portion 140, thereby enabling a current path during electrolytic solder plating. In some examples, the metal trace 114, the via 125, and the connection of the via 125 to the leadframe portion 140 (and the exposure of at least a portion of the metal trace 114 through the molding 112) creates a heat dissipation path that allows heat to exit the semiconductor package 100 in order to assist with preventing the semiconductor package 100 from overheating and potentially causing damage to its components.

Figures 2A, 2B, 2C:
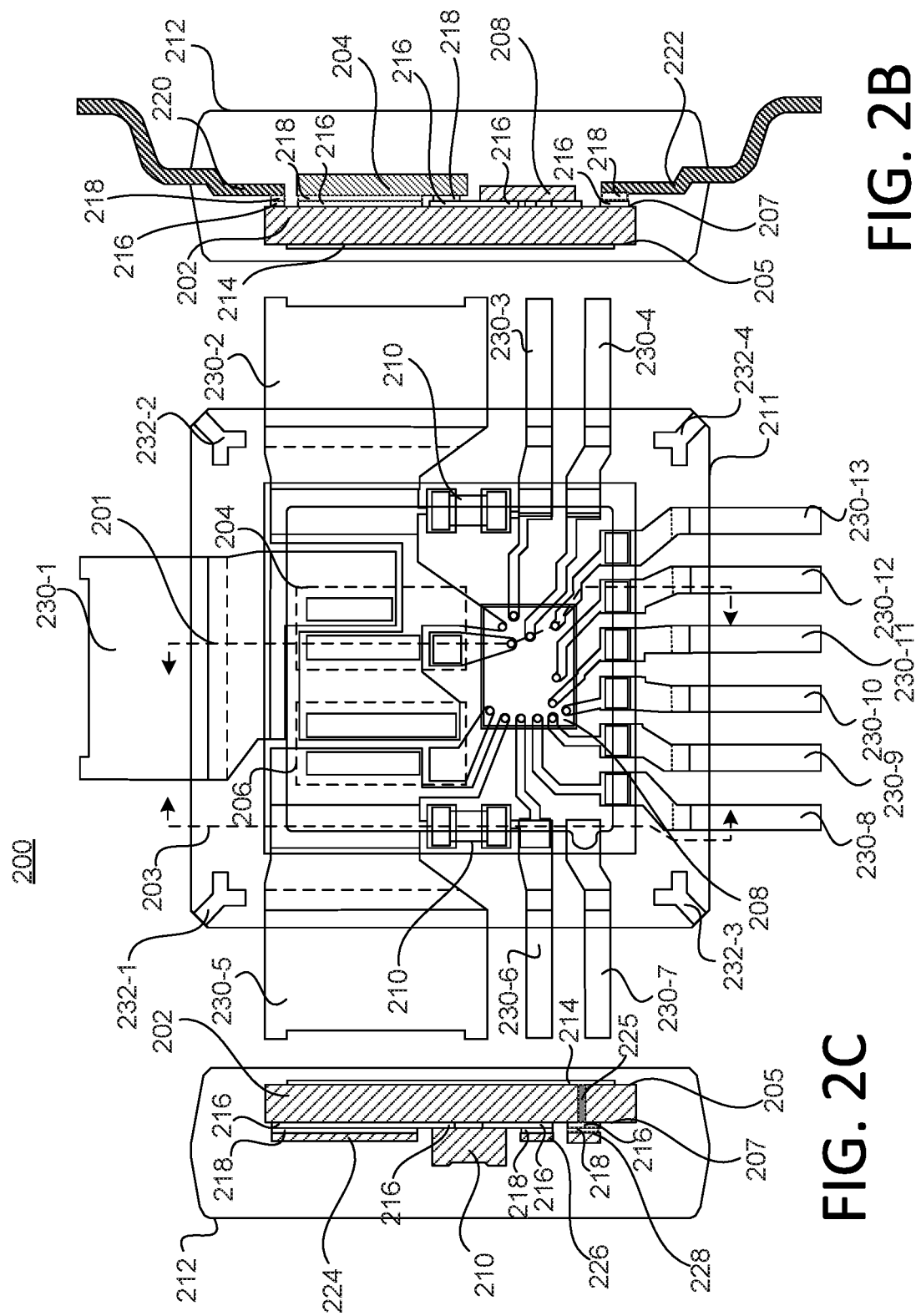
FIGS. 2A through 2H illustrate a semiconductor package according to another aspect.
Figure 2D:
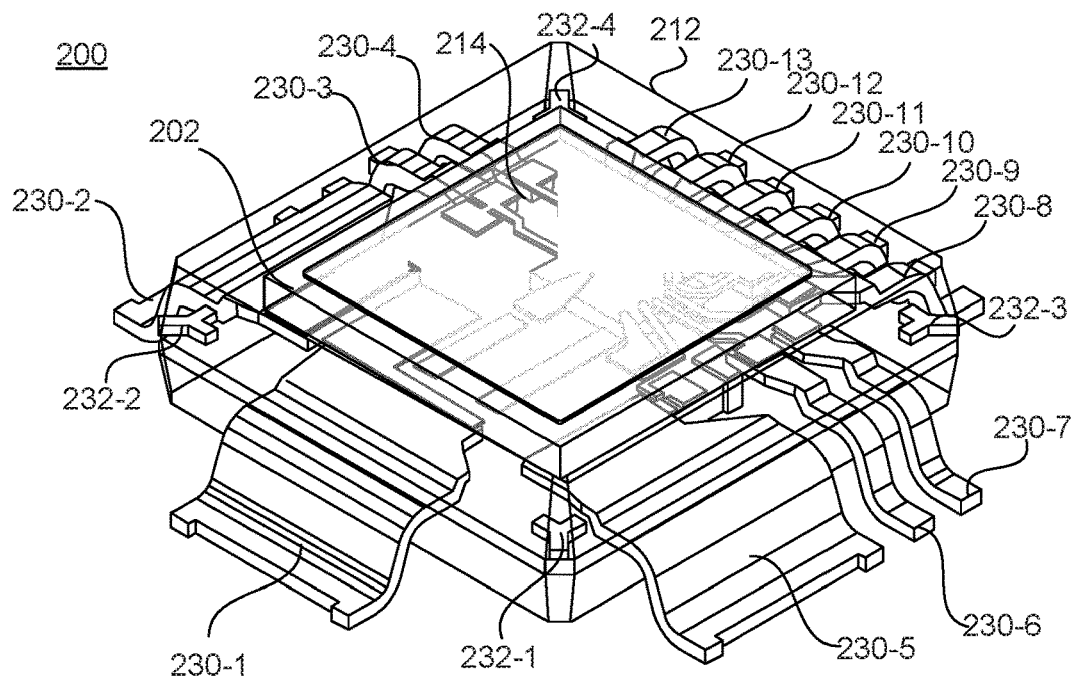
Figure 2E:
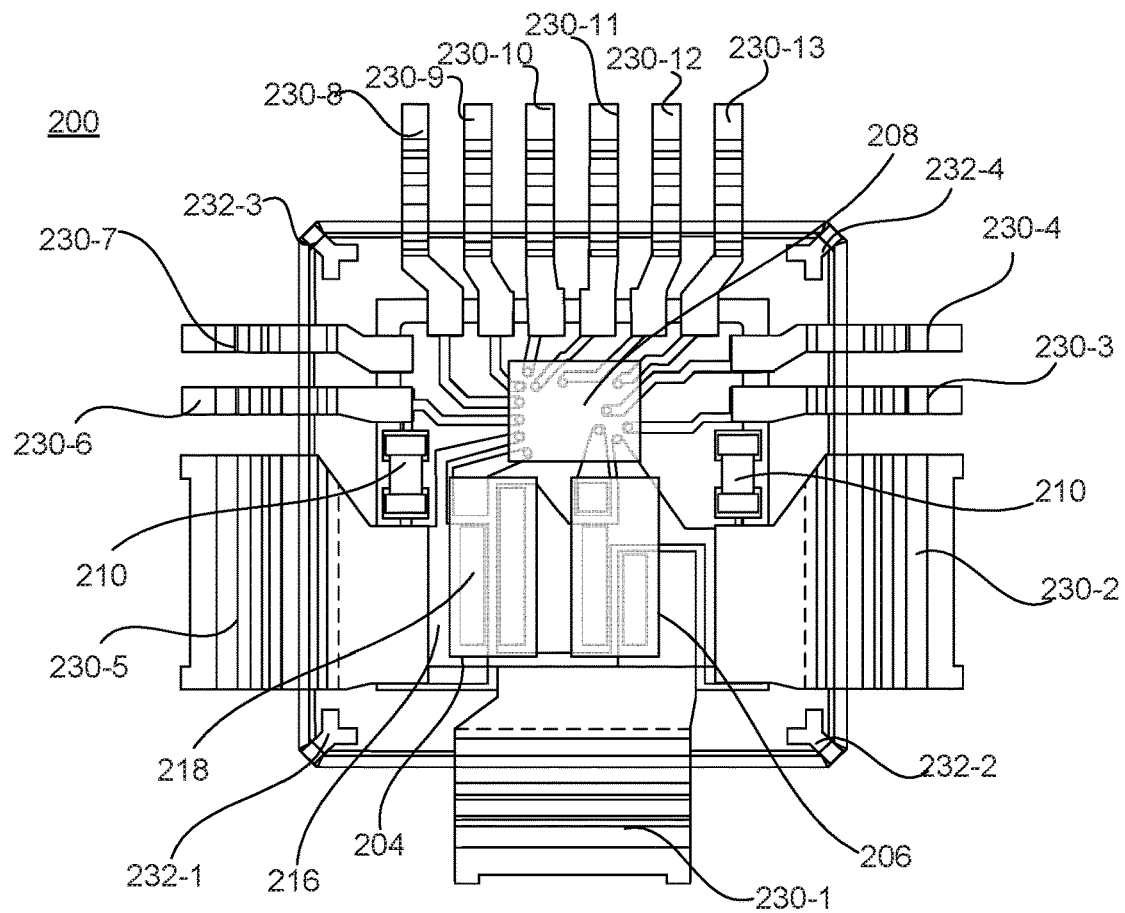
Figure 2F:
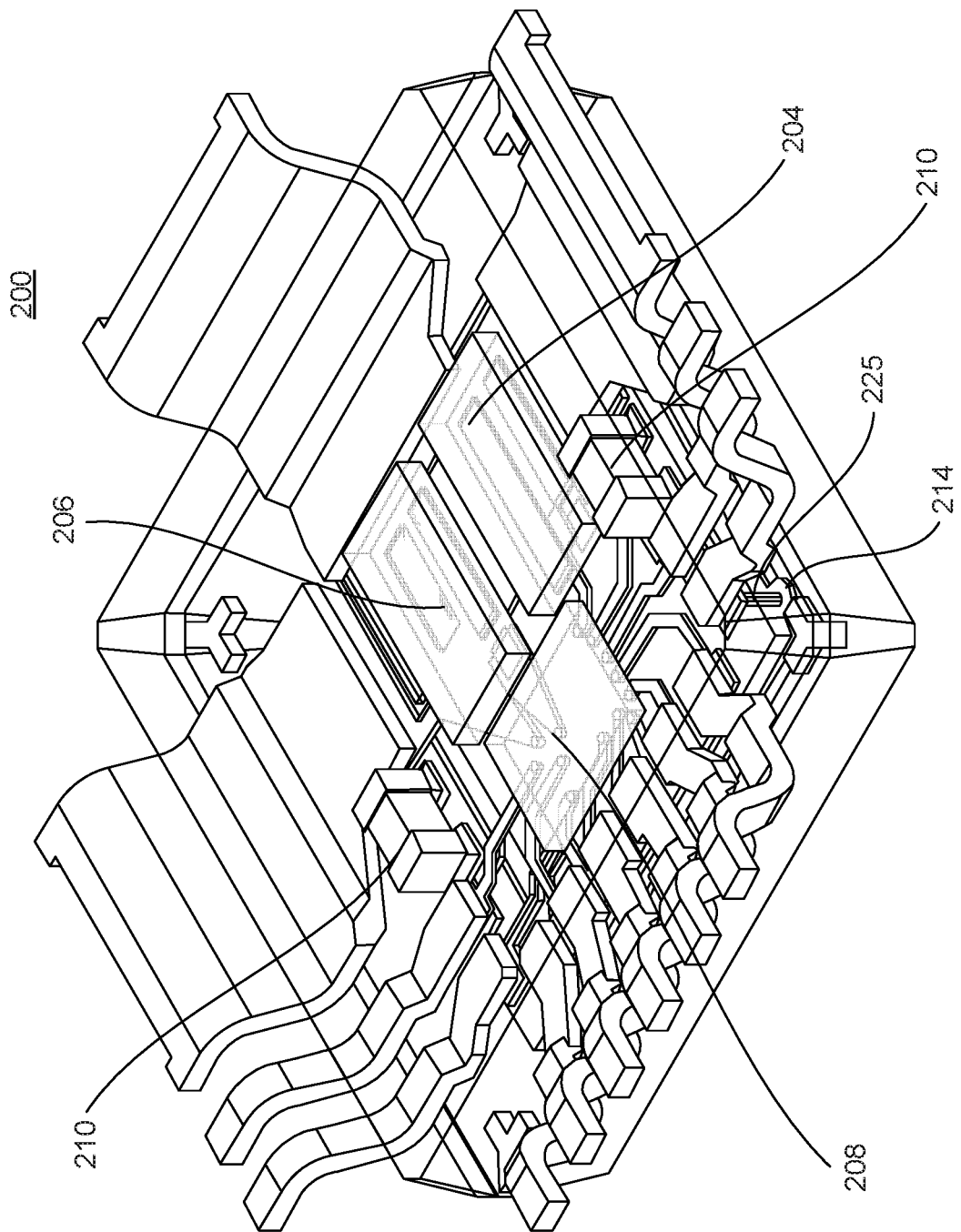
Figure 2G:
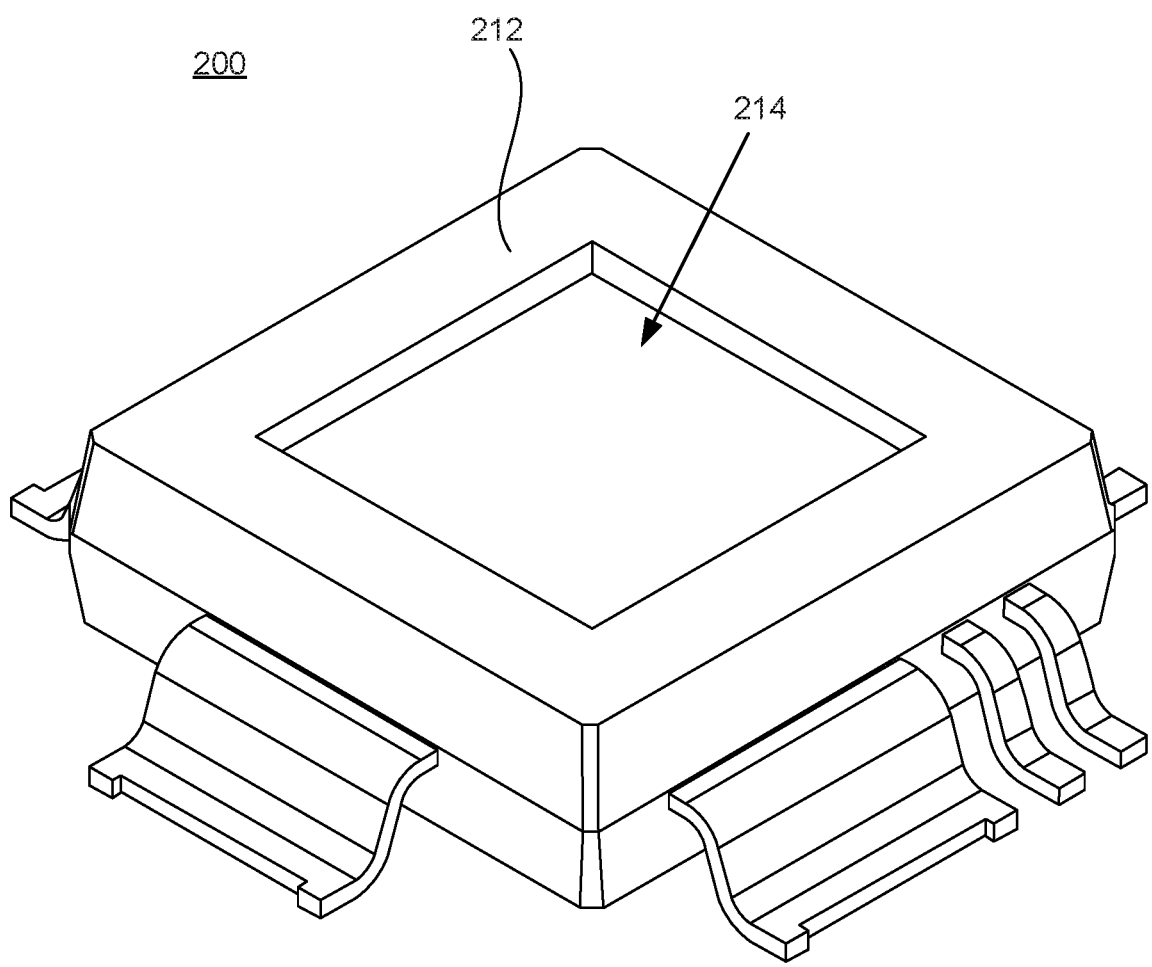
Figure 2H:
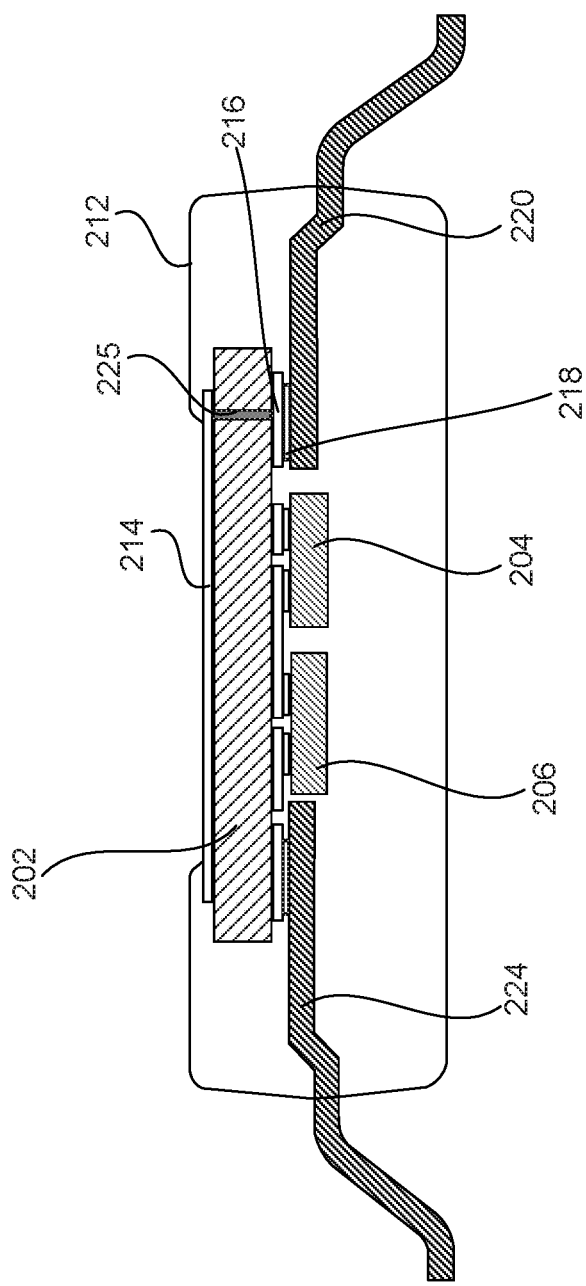

FIG. 2A illustrates a semiconductor package 200 according to an aspect. FIG. 2B illustrates a cross-sectional view of the semiconductor package 200, taken along line 201, according to an aspect. FIG. 2C illustrates a cross-sectional view of the semiconductor package 200, taken along line 203, according to an aspect. FIG. 2D illustrates an isometric top view of the semiconductor package 200 according to an aspect. FIG. 2E illustrates a package construction view of the semiconductor package 200 according to an aspect. FIG. 2F illustrates an isometric bottom view of the semiconductor package 200 according to an aspect. FIG. 2G illustrates an isometric solid top view of the semiconductor package 200 according to an aspect. FIG. 2H illustrates a cross-sectional view of the semiconductor package 200 according to an aspect. In some examples, the semiconductor package 200 includes a two-sided molding and four-sided lead-formed package.

The semiconductor package 200 may reduce the resistance and inductance of the interconnectors for at least some of the package's components, and may provide an exit path for heat that is generated when the semiconductor package 200 is activated. For example, the semiconductor package 200 includes a substrate 202 configured to function as a heatsink by exposing at least a portion of the substrate 202 through a molding 212. In some examples, the dielectric material of a surface of the substrate 202 is exposed through the molding 212 on the package exterior. In some examples, a redistribution layer (e.g., a metal trace, or copper metal trace) is coupled to the surface of the substrate 202, and at least a portion of the redistribution layer is exposed through the molding 212 on the package exterior, as shown in FIG. 2G. In some examples, the redistribution layer is solder plated. For example, during the lead finishing process, solder plating may be deposited on the redistribution layer. In some examples, the surface of the substrate 202 is exposed by grinding down the molding 212 in order to expose at least a portion of the surface or the redistribution layer. In some examples, a recess is formed in the molding 212 in order to expose at least a portion of the surface or the redistribution layer.

The semiconductor package 200 includes the substrate 202, a first semiconductor die 204, a second semiconductor die 206, and a third semiconductor die 208. In some examples, the first semiconductor die 204, the second semiconductor die 206, and the third semiconductor die 208 are the active components within the semiconductor package 200.

In some examples, the first semiconductor die 204 includes a low-side semiconductor power device. In some examples, the first semiconductor die 204 includes a transistor (e.g., bipolar junction transistor, field-effect transistor, a metal-oxide-semiconductor field-effect transistor (MOSFET)). In some examples, the first semiconductor die 204 includes one or more integrated circuits (ICs). In some examples, the first semiconductor die 204 includes a field-effect transistor (FET). In some examples, the first semiconductor die 204 includes a gallium nitride (GaN) low-side semiconductor die.

In some examples, the second semiconductor die 206 includes a high-side semiconductor power device. In some examples, the second semiconductor die 206 includes a transistor (e.g., bipolar junction transistor, field-effect transistor, a metal-oxide-semiconductor field-effect transistor (MOSFET)). In some examples, the second semiconductor die 206 includes one or more ICs. In some examples, the second semiconductor die 206 includes a field-effect transistor (FET). In some examples, the second semiconductor die 206 includes a gallium nitride (GaN) low-side semiconductor die. In some examples, the third semiconductor die 208 includes a driver IC die. In some examples, the third semiconductor die 208 includes a transistor (e.g., bipolar junction transistor, field-effect transistor, a metal-oxide-semiconductor field-effect transistor (MOSFET)). In some examples, the third semiconductor die 208 includes one or more ICs. In some examples, the semiconductor package 200 houses the first semiconductor die 204 and the second semiconductor die 206 at an isolation gap compatible for 650V-800V or a higher voltage isolation rating (e.g., greater than 800V).

The molding 212 encapsulates at least a majority of the components of the semiconductor package 200. In some examples, the molding 212 encapsulates all of the components of the semiconductor package 200 except for a portion of the substrate 202 (and the leads that extend from the molding 212). In some examples, the molding 212 includes an inorganic material. In some examples, the molding 212 includes an organic material. In some examples, the molding 212 includes a combination of one or more organic materials and/or one or more inorganic materials. In some examples, the molding 212 includes an epoxy material formed from epoxy resins. In some examples, the molding 212 includes a gel material (e.g., silicone gel).

The first semiconductor die 204, the second semiconductor die 206, and third semiconductor die 208 are coupled to the substrate 202. In some examples, the semiconductor package 200 includes one or more passive devices 210 coupled to the substrate 202. A passive device 210 may be any type of device that does not generate energy but can store energy or dissipate energy. In some examples, the passive devices 210 include capacitors. In some examples, the passive devices 210 include resistors, inductors, and/or transformers.

The semiconductor package 200 includes a lead frame defining a plurality of leads such as a first lead 230-1, a second lead 230-2, a third lead 230-3, a fourth lead 230-4, a fifth lead 230-5, a sixth lead 230-6, a seventh lead 230-7, an eighth lead 230-8, a ninth lead 230-9, a tenth lead 230-10, an eleventh lead 230-11, a twelfth lead 230-12, and a thirteenth lead 230-13. A portion of the leads may be considered a leadframe portion. In some examples, the semiconductor package 200 includes less than thirteen leads. In some examples, the semiconductor package 200 includes more than thirteen leads. The leads may define the external contacts, pins, or inputs/outputs (I/Os) for connecting the semiconductor package 200 to one or more external devices. In some examples, the semiconductor package 200 includes tie bar components disposed at the corner portions of the semiconductor package 200 such as a first tie bar 232-1, a second tie bar 232-2, a third tie bar 232-3, and a fourth tie bar 232-4. The tie bars (e.g., 232-1, 232-2, 232-3, and 232-4) are attached between the corners of a die mount pad 211 and the lead frame which may form, in part, the dam bars that hold the leads spaced at desired intervals during the package molding process.

Each of the leads may be any type of lead used in a packaging structure. In some examples, the leads include one or more curved or bent portions that extend from the molding 212. In some examples, the first lead 230-1 is an input voltage (VIN) lead. In some examples, the second lead 230-2 is a switch (SW) lead. In some examples, the third lead 230-3 is a high power supply voltage (VDDH) lead. In some examples, the fourth lead 230-4 is a boot (BOOT) lead. In some examples, the fifth lead 230-5 is a power switch ground (PGND) lead. In some examples, the sixth lead 230-6 is a low power supply voltage (VDDL) lead. In some examples, the seventh lead 230-7 is a non-contact (NC) lead. In some examples, the eighth lead 230-8 is an enable (EN) lead. In some examples, the ninth lead 230-9 is a low side input (LIN) lead. In some examples, the tenth lead 230-10 is a high side input (HIN) lead. In some examples, the eleventh lead 230-11 is a DT lead. In some examples, the twelfth lead 230-12 is a signal ground (SGND) lead. In some examples, the thirteenth lead 230-13 is a power supply (VDD) lead.

The substrate 202 includes a dielectric material. In some examples, the substrate 202 is a ceramic substrate. The substrate 202 includes a first surface 205 and a second surface 207 opposite to the first surface 205. In some examples, the first surface 205 and the second surface 207 are planar or substantially planar. In some examples, the first surface 205 is considered a top surface. In some examples, the first surface 205 is the surface that is exposed through the molding 212. In some examples, the second surface 207 is considered a bottom surface. In some examples, the second surface 207 is the surface that attaches to the leadframe portions and/or the first semiconductor die 204, the second semiconductor die 206, and third semiconductor die 208. The distance between the first surface 205 and the second surface 207 may define a thickness of the substrate 202. In some examples, the thickness of the substrate 202 is in a range of 15 to 100 mils. In some examples, the thickness of the substrate 202 is at least 15 mils. In some examples, the thickness of the substrate 202 is below 15 mils.

As shown in FIGS. 2B and 2F, the first semiconductor die 204 and the third semiconductor die 208 are coupled to the second surface 207 of the substrate 202. Also, as shown in FIGS. 2C, 2F, and 2H, the second semiconductor die 206 and the passive devices 210 are coupled to the second surface 207 of the substrate 202. In some examples, the first semiconductor die 204, the second semiconductor die 206, and the third semiconductor die 208 are coupled to the second surface 207 of the substrate 202 in a flip-chip configuration.

In some examples, three redistribution layers (e.g., metal traces) are coupled to (or formed on top of) the substrate 202, which include a top redistribution layer coupled to the first surface 205 of the substrate 202, a first bottom redistribution layer coupled to the second surface 207 of the substrate 202, and a second bottom redistribution layer coupled to the first bottom redistribution layer. In some examples, two redistribution layers are coupled to the substrate 202 (e.g., a top redistribution layer is omitted). In some examples, one redistribution layer is coupled to the substrate 202 (e.g., the top redistribution layer and the second bottom redistribution layer are omitted). Each of the first semiconductor die 204, the second semiconductor die 206, the third semiconductor die 208, and the passive devices 210 are connected to the first bottom redistribution layer and/or the second bottom redistribution layer.

In further detail, a first metal trace 214 (e.g., the top redistribution layer) is coupled to the first surface 205 of the substrate 202. In some examples, the first metal trace 214 is coupled directly to the first surface 205 of the substrate 202. In some examples, the first metal trace 214 is a copper metal trace. As shown in FIG. 2D, at least a portion of the first metal trace 214 may be exposed through the molding 212. In some examples, an entire outer surface of the first metal trace 214 is exposed through the molding 212.

A second metal trace 216 (e.g., the first bottom redistribution layer) is coupled to the second surface 207 of the substrate 202. In some examples, the second metal trace 216 is coupled directly to the second surface 207 of the substrate 202. In some examples, the second metal trace 216 is a copper metal trace. As shown in FIG. 2B, the third semiconductor die 208 is connected to the second metal trace 216. In some examples, the third semiconductor die 208 is soldered to the second metal trace 216. In some examples, the third semiconductor die 208 is connected to the second metal trace 216 via one or more conductive components (e.g., bumps, pillars, etc.). A third metal trace 218 (e.g. the second bottom redistribution layer) is coupled to portions of the second metal trace 216. In some examples, the third metal trace 218 is coupled directly to portions of the second metal trace 216. In some examples, the third metal trace 218 is a copper metal trace. In some examples, the third metal trace 218 may operate as a spacer underneath the flipped dice (e.g., the first semiconductor die 204, the second semiconductor die 206) for proper mold filing. In some examples, the third metal trace 218 may provide the correct Z-height clearance to meet the isolation requirement and for stack assembly when connected to the leadframe.

In some examples, the first semiconductor die 204 is connected to the third metal trace 218. In some examples, the first semiconductor die 204 is soldered to the third metal trace 218. In some examples, the first semiconductor die 204 is connected to the third metal trace 218 via one or more conductive components (e.g., bumps, pillars, etc.). In some examples, the second semiconductor die 206 is connected to the third metal trace 218. In some examples, the second semiconductor die 206 is soldered to the third metal trace 218. In some examples, the second semiconductor die 206 is connected to the third metal trace 218 via one or more conductive components (e.g., bumps, pillars, etc.).

As shown in FIG. 2B, a leadframe portion 220 is connected to the third metal trace 218, and a lead frame portion 222 is connected to the third metal trace 218. In some examples, the leadframe portion 220 is a portion of the first lead 230-1 (e.g., VIN lead), and the leadframe portion 222 is a portion of the twelfth lead 230-12 (e.g., SGND lead).

As shown in FIG. 2C, a leadframe portion 224, a passive devices 210, a leadframe portion 226, and a leadframe portion 228 are coupled to the substrate 202 via at least one of the second metal trace 216 or the third metal trace 218. In some examples, the leadframe portion 224 is connected to the third metal trace 218. For example, the second metal trace 216 and the third metal trace 218 are disposed between the leadframe portion 226 and the substrate 202, and the leadframe portion 224 is directly connected to the third metal trace 218. In other examples, the second metal trace 216 is disposed between the leadframe portion 226 and the substrate 202 (e.g., not the third metal trace 218). In some examples, the leadframe portion 224 is a portion of the fifth lead 230-5 (e.g., PGND lead).

In some examples, the passive device 210 is bonded to the substrate 202. In some examples, the passive device 210 is connected to the second metal trace 216. For example, the second metal trace 216 is disposed between the passive devices 210 and the substrate 202. In some examples, the leadframe portion 226 is connected to the third metal trace 218. In some examples, the second metal trace 216 and the third metal trace 218 are disposed between the leadframe portion 226 and the substrate 202. In some examples, the leadframe portion 226 is a portion of the sixth lead 230-6 (e.g., VDDL lead). In some examples, the leadframe portion 228 is connected to the third metal trace 218. For example, the second metal trace 216 and the third metal trace 218 are disposed between the leadframe portion 228 and the substrate 202. In some examples, the leadframe portion 228 is a portion of the seventh lead 230-7 (e.g., NC lead).

As shown in FIGS. 2C and 2F, the substrate 202 includes a via 225 that extends through the substrate 202. In some examples, the substrate 202 includes multiple vias 225. In some examples, the via 225 is a hole with metal filling. In some examples, the via 225 is a copper-filled via that enables the first metal trace 214 to be solder plated. In some examples, the via 225 is coupled to the leadframe portion 228. The via 225 may connect the first metal trace 214 to the leadframe portion 228, thereby enabling a current path during electrolytic solder plating. The via 225 may extend through the substrate 202 between the first metal trace 214 and the second metal trace 216 at a location proximate to the leadframe portion 228. In some examples, as discussed above, the leadframe portion 228 is part of the NC lead. In some examples, the via 225 may enable the first metal trace 214 to be solder plated. For example, if there is available space for an NC lead, the NC lead can be utilized as an interim connection to the first metal trace 214, which passes through the via 225. Therefore, during the lead finishing process, solder plating may be deposited on the first metal trace 214. In some examples, the NC lead can either be soldered as a dummy lead on a printed circuit board (PCB).

Figure 3A:
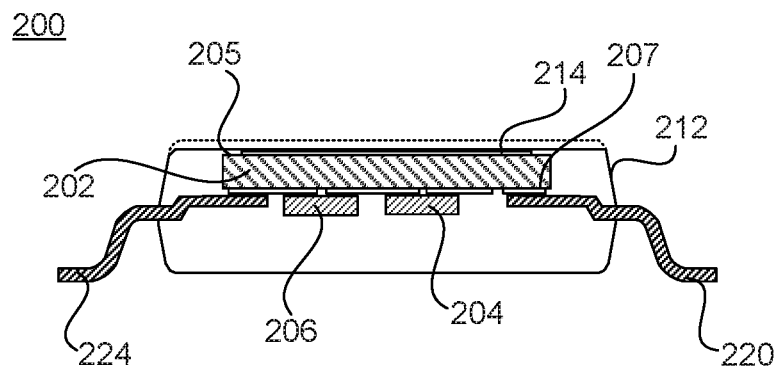
FIGS. 3A and 3B illustrate the exposure of a substrate through a molding of a semiconductor package according to an aspect.
Figure 3B:
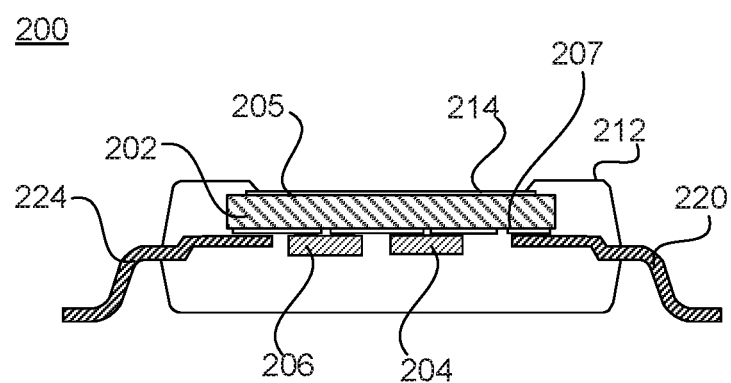

FIGS. 3A and 3B illustrate the semiconductor package 200 with top side cooling options according to an aspect. The semiconductor package 200 of FIGS. 3A and 3B may include any of the features as discussed with respect to the previous figures. For example, the first metal trace 214 is coupled to the first surface 205 of the substrate 202, and the leadframe portion 224, the second semiconductor die 206, the first semiconductor die 204, the leadframe portion 220 are coupled to the second surface 207 of the substrate 202 (e.g., via the second metal trace 216 and the third metal trace 218).

In FIG. 3A, in some examples, the top surface of the molding 212 is grinded down in order to expose the first metal trace 214. In this example, the top surface of the molding 212 is adjacent to and substantially planar with the top surface of the first metal trace 214. In some examples, the entire top surface of the first metal trace 214 is exposed through the molding 212. In FIG. 3B, a recessed in formed in the molding 212 in order to expose the first metal trace 214. In some examples, a portion of the first metal trace 214 is exposed through the molding 212, and a portion of the first metal trace 214 is covered by the molding 212. In some examples, referring to FIG. 3B, the top surface of the first metal trace 214 is disposed below the top surface of the molding 212.

Figures 4A, 4B:
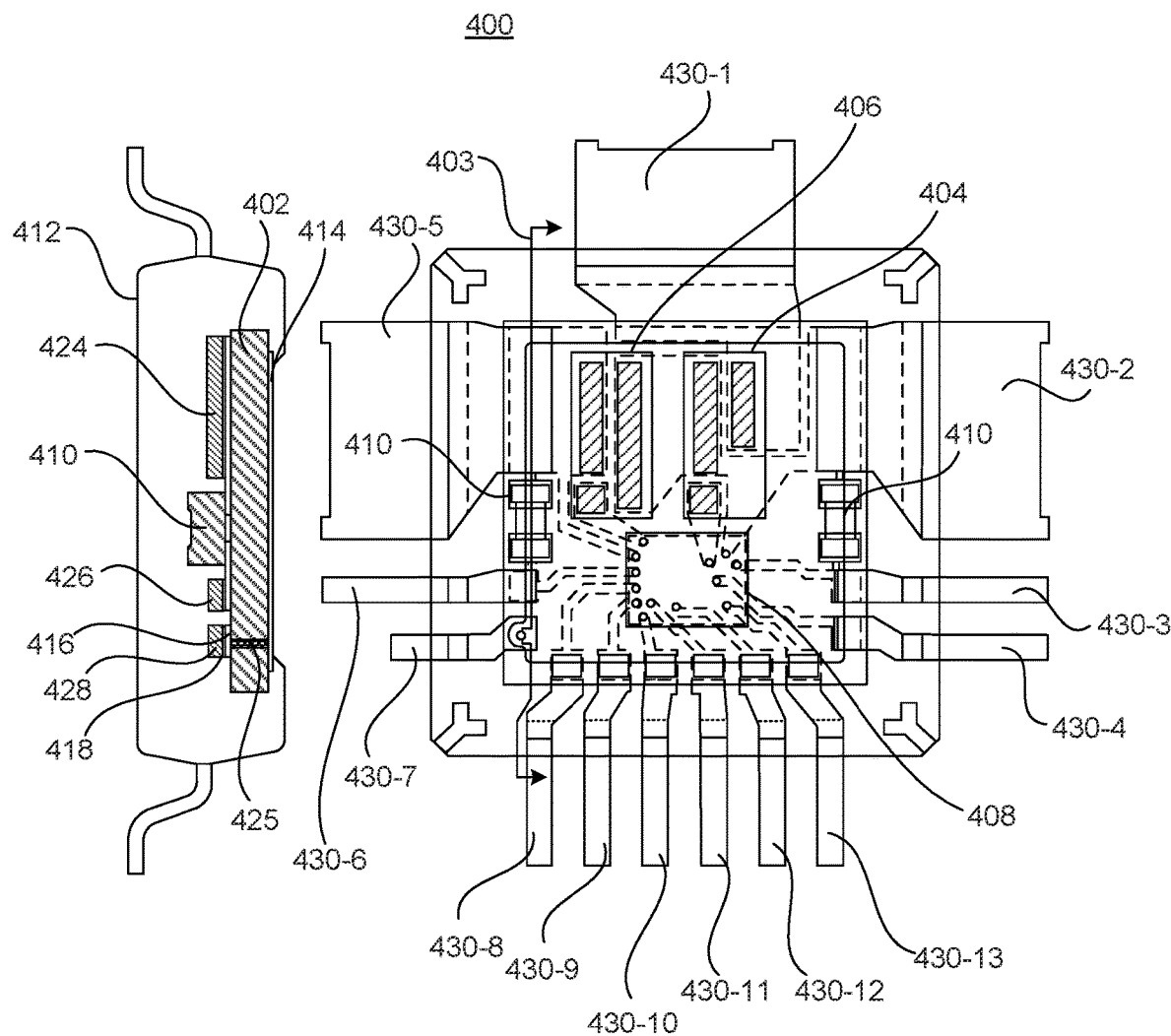
FIGS. 4A and 4B illustrate a semiconductor package according to another aspect.

FIGS. 4A and 4B illustrate a semiconductor package 400 that is similar to the semiconductor package 200 of FIGS. 2A through 3B except that a seventh lead 430-7 (e.g., the NC lead) is trimmed-off (e.g., hanging free on package side). FIG. 4A illustrate a perspective of the semiconductor package 400 according to an aspect. FIG. 4B illustrates a cross-section of the semiconductor package 400, taken along line 403, according to an aspect. FIGS. 4A and 4B illustrate an example of an isolated solderable heatsink. The semiconductor package 400 may include any of the features discussed with reference to the previous figures.

For example, the semiconductor package 400 includes a substrate 402, a first semiconductor die 404, a second semiconductor die 406, a third semiconductor die 408, passive devices 410, a first metal trace 414, a second metal trace 416, and a third metal trace 418. The semiconductor package 400 includes a molding 412 that encapsulates all of the components of the semiconductor package 400 except for a portion of the substrate 402 and the portions of the leads that extend from the molding 412. The semiconductor package 400 includes a lead frame defining a plurality of leads such as a first lead 430-1, a second lead 430-2, a third lead 430-3, a fourth lead 430-4, a fifth lead 430-5, a sixth lead 430-6, a seventh lead 430-7, an eighth lead 430-8, a ninth lead 430-9, a tenth lead 430-10, an eleventh lead 430-11, a twelfth lead 430-12, and a thirteenth lead 430-13.

As shown in FIG. 4B, a leadframe portion 424, a passive device 410, a leadframe portion 426, and a leadframe portion 428 are coupled to the substrate 402 via at least one of the second metal trace 416 or the third metal trace 418. In some examples, the leadframe portion 424 is a portion of the fifth lead 430-5 (e.g., the PGND lead). In some examples, the leadframe portion 426 is a portion of the sixth lead 430-6 (e.g., VDDL lead). In some examples, the leadframe portion 428 is a portion of the seventh lead 430-7 (e.g., NC lead).

As shown in FIG. 4B, the substrate 402 includes a via 425 that extends through the substrate 402. In some examples, the via 425 is a copper-filled via that enables the first metal trace 414 to be solder plated. For example, if there is available space for an NC lead, the NC lead can be utilized as an interim connection to the first metal trace 414, which passes through the via 425. Therefore, during the lead finishing process, solder plating may be deposited on the first metal trace 414. In some examples, as shown in FIG. 4A, the seventh lead 430-7 (e.g., the NC lead) is trimmed-off (e.g., hanging free on the package side).

Figures 5A, 5B:
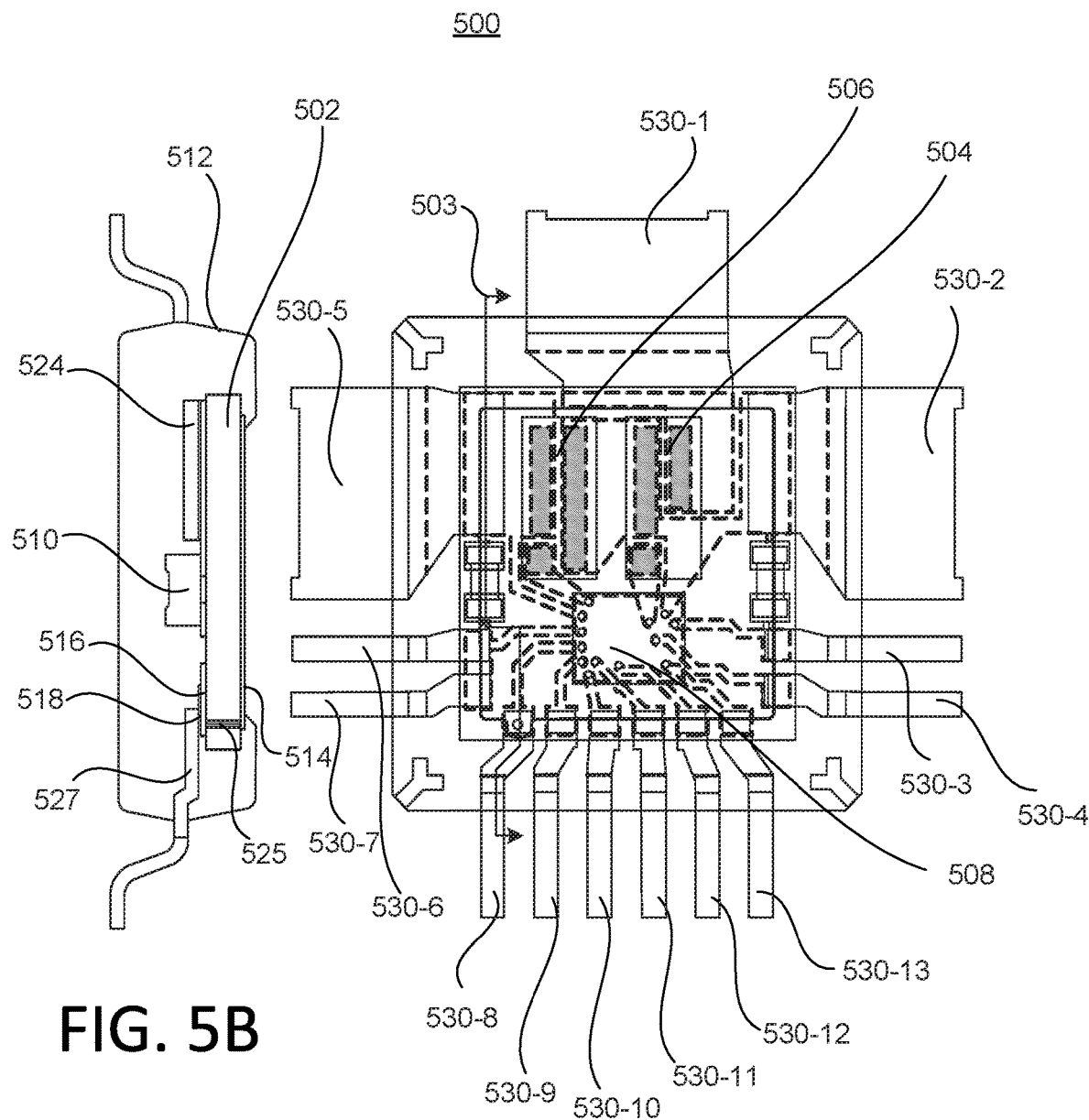
FIGS. 5A and 5B illustrate a semiconductor package according to another aspect.

FIGS. 5A and 5B illustrate a semiconductor package 500 that is similar to the semiconductor package 200 of FIGS. 2A through 3B or the semiconductor package 400 of FIGS. 4A and 4B except that a neutral lead (e.g., an eighth lead 530-8 (e.g., EN lead)) is used as an electrolytic conduction path to a first metal trace 514. In the example of FIGS. 2A through 3B, the seventh lead 230-7 (e.g., NC lead) is used as the electrolytic conduction path to the first metal trace 214. In the example of FIGS. 4A and 4B, the seventh lead 430-7 (e.g., the NC lead) is used as the electrolytic conduction path to the first metal trace 414, but the seventh lead 430-7 is shorter than the seventh lead 230-7 of FIGS. 2A through 3B. In the example of FIGS. 5A and 5B, the eighth lead 530-8 (e.g., the EN lead) is used as an electrolytic conduction path to the first metal trace 514.

FIG. 5A illustrate a perspective of the semiconductor package 500 according to an aspect. FIG. 5B illustrates a cross-section of the semiconductor package 500, taken along line 503, according to an aspect. FIGS. 5A and 5B illustrate an example of an isolated solderable heatsink. The semiconductor package 500 may include any of the features discussed with reference to the previous figures.

For example, the semiconductor package 500 includes a substrate 502, a first semiconductor die 504, a second semiconductor die 506, a third semiconductor die 508, passive devices 510, the first metal trace 514, a second metal trace 516, and a third metal trace 518. The semiconductor package 500 includes a molding 512 that encapsulates most of the components of the semiconductor package 500 except for a portion of the substrate 502 and portions of the leads that extend from the molding 512. The semiconductor package 500 includes a lead frame defining a plurality of leads such as a first lead 530-1, a second lead 530-2, a third lead 530-3, a fourth lead 530-4, a fifth lead 530-5, a sixth lead 530-6, a seventh lead 530-7, the eighth lead 530-8, a ninth lead 530-9, a tenth lead 530-10, an eleventh lead 530-11, a twelfth lead 530-12, and a thirteenth lead 530-13.

As shown in FIG. 5B, a leadframe portion 524, a passive device 510, and a leadframe portion 527 are coupled to the substrate 502 via at least one of the second metal trace 516 or the third metal trace 518. In some examples, the leadframe portion 524 is a portion of the fifth lead 530-5 (e.g., PGND lead). In some examples, the leadframe portion 527 is a portion of the eighth lead 530-8 (e.g., EN lead).

As shown in FIG. 5B, the substrate 502 includes a via 525 that extends through the substrate 502. In some examples, the via 525 is a copper-filled via that enables the first metal trace 514 to be solder plated. For example, if there is not sufficient space for a dummy lead (or non-functional lead (NC lead)), a neutral I/O lead may be utilized as an electrolytic conduction path to the first metal trace 514 (through the via 525). In some examples, the EN lead may be considered neutral relative to the PGND lead, the VIN lead, and the SW lead, and therefore may not have creepage restrictions.

Figures 6A, 6B:
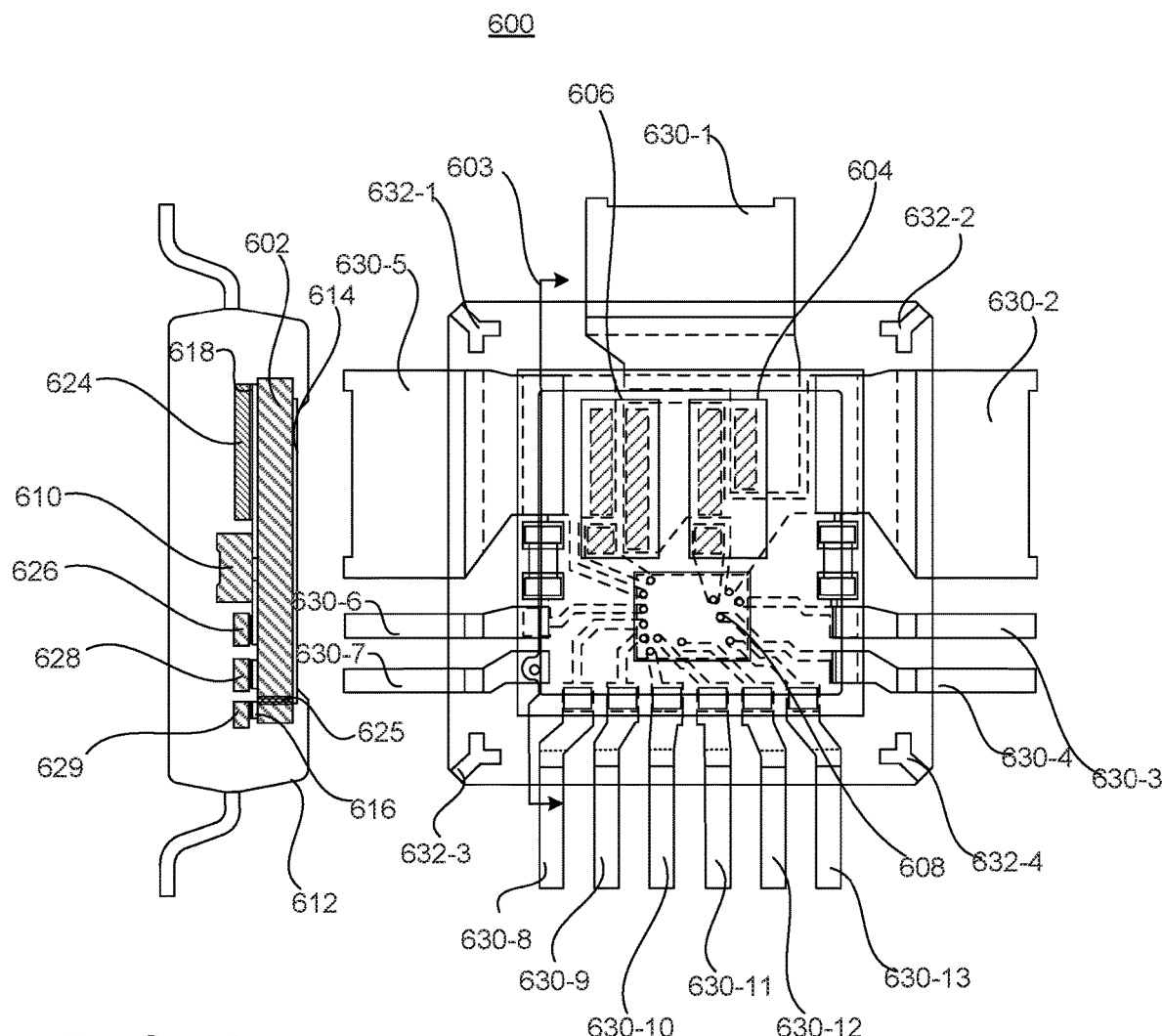
FIGS. 6A and 6B illustrate a semiconductor package according to another aspect.

FIGS. 6A and 6B illustrate a semiconductor package 600 that is similar to the semiconductor package 200 of FIGS. 2A through 3B, the semiconductor package 400 of FIGS. 4A and 4B, or the semiconductor package 500 of FIGS. 5A and 5B except that a tie bar (e.g., a third tie bar 632-3) is used as an electrolytic conduction path to a first metal trace 614. FIG. 6A illustrate a perspective of the semiconductor package 600 according to an aspect. FIG. 6B illustrates a cross-section of the semiconductor package 600, taken along line 603, according to an aspect. FIGS. 6A and 6B illustrate an example of an isolated solderable heatsink. The semiconductor package 600 may include any of the features discussed with reference to the previous figures.

For example, the semiconductor package 600 includes a substrate 602, a first semiconductor die 604, a second semiconductor die 606, a third semiconductor die 608, passive devices 610, a first metal trace 614, a second metal trace 616, a third metal trace 618, and a molding 612. The semiconductor package 600 includes a lead frame defining a plurality of leads such as a first lead 630-1, a second lead 630-2, a third lead 630-3, a fourth lead 630-4, a fifth lead 630-5, a sixth lead 630-6, a seventh lead 630-7, an eighth lead 630-8, a ninth lead 630-9, a tenth lead 630-10, an eleventh lead 630-11, a twelfth lead 630-12, and a thirteenth lead 630-13. In some examples, the semiconductor package 600 includes tie bar components disposed at the corner portions of the semiconductor package 600 such as a first tie bar 632-1, a second tie bar 632-2, the third tie bar 632-3, and a fourth tie bar 632-4.

As shown in FIG. 6B, a leadframe portion 624, a passive device 610, a leadframe portion 626, a leadframe portion 628, and a tie bar portion 629 are coupled to the substrate 602 via at least one of the second metal trace 616 or the third metal trace 618. In some examples, the leadframe portion 624 is a portion of the fifth lead 630-5 (e.g., PGND lead). In some examples, the leadframe portion 626 is a portion of the sixth lead 630-6 (e.g., VDDL lead). In some examples, the leadframe portion 628 is a portion of the seventh lead 630-7 (e.g., NC lead). In some examples, the tie bar portion 629 is a portion of the third tie bar 632-3.

As shown in FIG. 6B, the substrate 602 includes a via 625 that extends through the substrate 602. In some examples, the via 625 is a copper-filled via that enables the first metal trace 614 to be solder plated. For example, if there is not sufficient space for neither a dummy lead (non-functional lead (NC lead)) nor a neutral I/O lead, the corner singulation tie bar (e.g., the third tie bar 632-3) may be utilized as an electrolytic conduction path to the first metal trace 614 (through the via 625).

FIGS. 7A, 7B, and 7C illustrate a semiconductor package 700 with an exposed substrate configured as a hint sink and flat leads that extend from the package. In some examples, the semiconductor package 700 may be beneficial when there is a Z-height restriction on board mounting. In some examples, the semiconductor package 700 includes one-sided molding with flat leads. Although the semiconductor package 700 illustrates the leads on four sides, the semiconductor package 700 may include leads on only two sides. The semiconductor package 700 may include any of the features discussed with reference to the previous figures.

FIG. 7A illustrates a perspective of the semiconductor package 700 according to an aspect. FIG. 7B illustrates a cross-section of the semiconductor package 700, taken along line 701, according to an aspect. FIG. 7C illustrates a cross-section of the semiconductor package 700, taken along line 703, according to an aspect.

The semiconductor package 700 includes a substrate 702, a first semiconductor die 704, a second semiconductor die 706, and a third semiconductor die 708. In some examples, the first semiconductor die 704 includes a low-side semiconductor power device. In some examples, the second semiconductor die 706 includes a high-side semiconductor power device. The semiconductor package 700 includes a molding 712 that encapsulates at least a majority of the components of the semiconductor package 700. In some examples, the molding 712 encapsulates all of the components of the semiconductor package 700 except for a portion of the substrate 702 and the portions of the leads that extend from the molding 712.

The first semiconductor die 704, the second semiconductor die 706, and third semiconductor die 708 are coupled to the substrate 702. In some examples, the semiconductor package 700 includes one or more passive devices 710 coupled to the substrate 702. In some examples, the passive devices 710 include capacitors. In some examples, the passive devices 710 include resistors, inductors, and/or transformers.

The semiconductor package 700 includes a lead frame defining a plurality of leads such as a first lead 730-1, a second lead 730-2, a third lead 730-3, a fourth lead 730-4, a fifth lead 730-5, a sixth lead 730-6, a seventh lead 730-7, an eighth lead 730-8, a ninth lead 730-9, a tenth lead 730-10, an eleventh lead 730-11, a twelfth lead 730-12, and a thirteenth lead 730-13. A portion of the leads may be considered a leadframe portion. In some examples, the semiconductor package 700 includes less than thirteen leads. In some examples, the semiconductor package 700 includes more than thirteen leads. The leads may define the external contacts, pins, or inputs/outputs (I/Os) for connecting the semiconductor package 700 to one or more external devices. In some examples, the semiconductor package 700 includes tie bar components as shown in the previous figures.

Each of the leads may be any type of lead used in a packaging structure. In some examples, the portions of the leads that extend from the molding 712 are planar or flat (e.g., substantially devoid of a curvature). In some examples, the first lead 730-1 is the VIN lead, the second lead 730-2 is the SW lead, the third lead 730-3 is the VDDH lead, the fourth lead 730-4 is the BOOT lead, the fifth lead 730-5 is the PGND lead, the sixth lead 730-6 is the VDDL lead, the seventh lead 730-7 is the NC lead, the eighth lead 730-8 is the EN lead, the ninth lead 730-9 is the LIN lead, the tenth lead 730-10 is the HIN lead, the eleventh lead 730-11 is the DT lead, the twelfth lead 730-12 is the SGND lead, and the thirteenth lead 730-13 is the VDD lead.

The substrate 702 includes a dielectric material. In some examples, the substrate 702 is a ceramic substrate. The substrate 702 includes a first surface 705 and a second surface 707 opposite to the first surface 705. In some examples, the first surface 705 and the second surface 707 are planar or substantially planar. In some examples, the first surface 705 is considered a top surface. In some examples, the first surface 705 is the surface that is exposed through the molding 712. In some examples, the second surface 707 is considered a bottom surface. In some examples, the second surface 707 is the surface that attaches to the leadframe portions and/or the first semiconductor die 704, the second semiconductor die 706, and third semiconductor die 708. The distance between the first surface 705 and the second surface 707 may define a thickness of the substrate 702. In some examples, the thickness of the substrate 702 is in a range of 15 to 100 mils. In some examples, the thickness of the substrate 702 is at least 15 mils. In some examples, the thickness of the substrate 702 is below 15 mils.

As shown in FIG. 7B, the first semiconductor die 704 and the third semiconductor die 708 are coupled to the second surface 707 of the substrate 702. Also, as shown in FIG. 7C, the second semiconductor die 706 and the passive devices 710 are coupled to the second surface 707 of the substrate 702. In some examples, the first semiconductor die 704, the second semiconductor die 706, and the third semiconductor die 708 are coupled to the second surface 707 of the substrate 702 in a flip-chip configuration.

In some examples, three redistribution layers (e.g., metal traces) are coupled to (or formed on top of) the substrate 702, which include a top redistribution layer coupled to the first surface 705 of the substrate 702, a first bottom redistribution layer coupled to the second surface 707 of the substrate 702, and a second bottom redistribution layer coupled to the first bottom redistribution layer. In some examples, two redistribution layers are coupled to the substrate 702 (e.g., a top redistribution layer is omitted). In some examples, one redistribution layer is coupled to the substrate 702 (e.g., the top redistribution layer and the second bottom redistribution layer are omitted). Each of the first semiconductor die 704, the second semiconductor die 706, the third semiconductor die 708, and the passive devices 710 are connected to the first bottom redistribution layer and/or the second bottom redistribution layer.

In further detail, a first metal trace 714 (e.g., the top redistribution layer) is coupled to the first surface 705 of the substrate 702. In some examples, the first metal trace 714 is coupled directly to the first surface 705 of the substrate 702. In some examples, the first metal trace 714 is a copper metal trace. At least a portion of the first metal trace 714 may be exposed through the molding 712. In some examples, an entire outer surface of the first metal trace 714 is exposed through the molding 712.

A second metal trace 716 (e.g., the first bottom redistribution layer) is coupled to the second surface 707 of the substrate 702. In some examples, the second metal trace 716 is coupled directly to the second surface 707 of the substrate 702. In some examples, the second metal trace 716 is a copper metal trace. As shown in FIG. 7B, the third semiconductor die 708 is connected to the second metal trace 716. In some examples, the third semiconductor die 708 is soldered to the second metal trace 716. In some examples, the third semiconductor die 708 is connected to the second metal trace 716 via one or more conductive components (e.g., bumps, pillars, etc.). A third metal trace 718 (e.g. the second bottom redistribution layer) is coupled to portions of the second metal trace 716. In some examples, the third metal trace 718 is coupled directly to portions of the second metal trace 716. In some examples, the third metal trace 718 is a copper metal trace. In some examples, the third metal trace 718 may operate as a spacer underneath the flipped dice (e.g., the first semiconductor die 704, the second semiconductor die 706) for proper mold filing. In some examples, the third metal trace 718 may provide the correct Z-height clearance to meet the isolation requirement and for stack assembly when connected to the leadframe.

In some examples, the first semiconductor die 704 is connected to the third metal trace 718. In some examples, the first semiconductor die 704 is soldered to the third metal trace 718. In some examples, the first semiconductor die 704 is connected to the third metal trace 718 via one or more conductive components (e.g., bumps, pillars, etc.). In some examples, the second semiconductor die 706 is connected to the third metal trace 718. In some examples, the second semiconductor die 706 is soldered to the third metal trace 718. In some examples, the second semiconductor die 706 is connected to the third metal trace 718 via one or more conductive components (e.g., bumps, pillars, etc.).

As shown in FIG. 7B, a leadframe portion 720 is connected to the third metal trace 718, and a lead frame portion 722 is connected to the third metal trace 718. In some examples, the leadframe portion 720 is a portion of the first lead 730-1 (e.g., VIN lead), and the leadframe portion 722 is a portion of the twelfth lead 730-12 (e.g., SGND lead).

As shown in FIG. 7C, a leadframe portion 740, passive devices 710, the second semiconductor die 706, the first semiconductor die 704, and a leadframe portion 742 are coupled to the substrate 702 via at least one of the second metal trace 716 or the third metal trace 718. In some examples, the leadframe portion 740 is connected to the third metal trace 718. In some examples, the leadframe portion 740 is a portion of the fifth lead 730-5 (e.g., the PGND lead). In some examples, the passive devices 710 are bonded to the second surface 707 of the substrate 702. In some examples, the passive devices 710 are connected to the second metal trace 716. In some examples, the leadframe portion 742 is connected to the third metal trace 718. In some examples, the leadframe portion 742 is a portion of the second lead 730-2 (e.g., the SW lead).

Figures 8A, 8B:
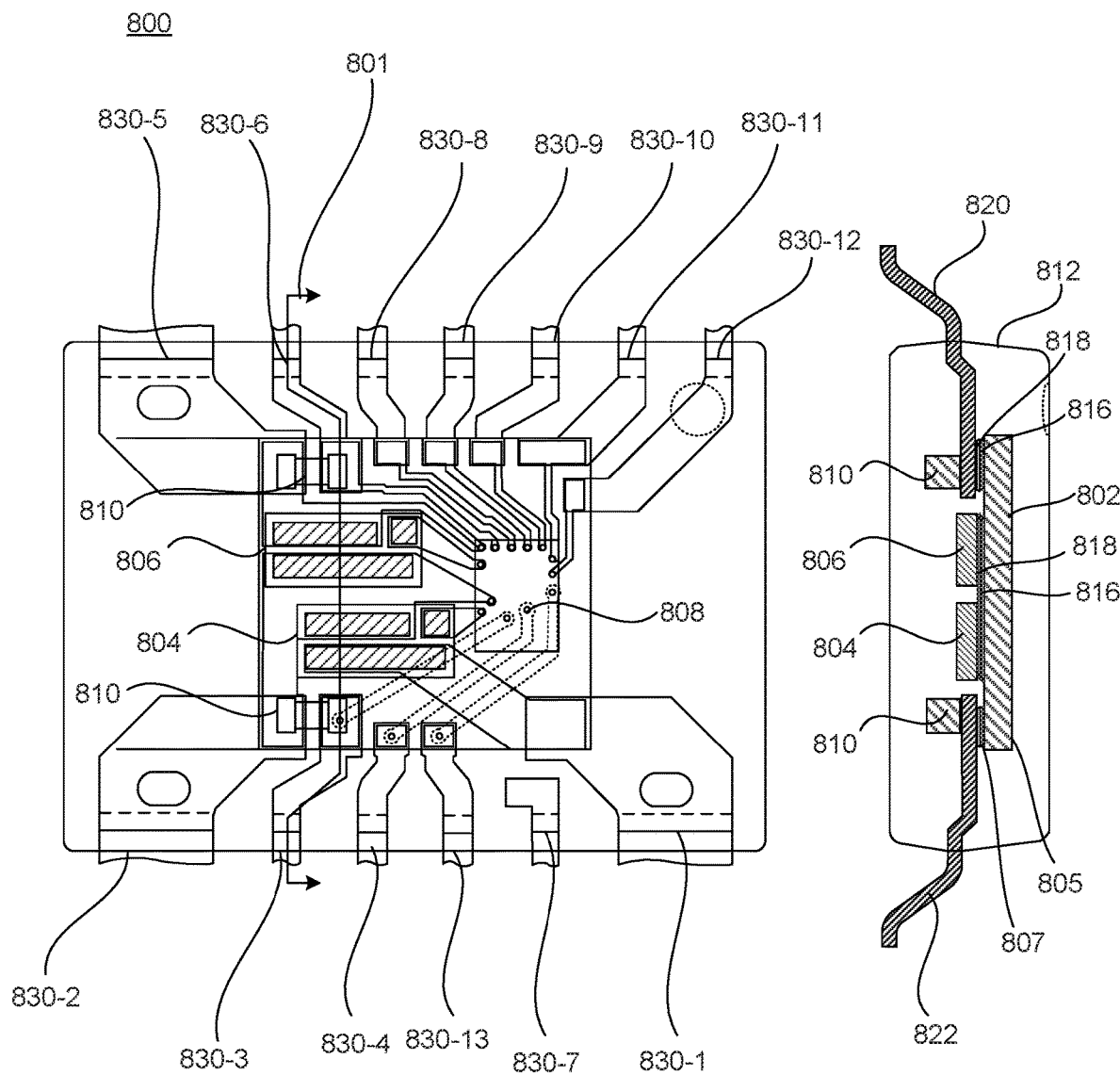
FIGS. 8A and 8B illustrate a semiconductor package according to another aspect.

FIGS. 8A and 8B illustrate a semiconductor package 800 with an exposed substrate configured as a hint sink according to aspect. The semiconductor package 800 may include leads on only two sides. The semiconductor package 800 may include any of the features discussed with reference to the previous figures. The semiconductor package 800 may be similar to the semiconductor packages previous discussed except that passive devices 810 are coupled to the leadframe on a side that is opposite to a substrate 802 and the leads are included on two sides of the semiconductor package 800.

FIG. 8A illustrates a perspective of the semiconductor package 800 according to an aspect. FIG. 8B illustrates a cross-section of the semiconductor package 800, taken along line 801, according to an aspect. The semiconductor package 800 includes the substrate 802, a first semiconductor die 804, a second semiconductor die 806, and a third semiconductor die 808. In some examples, the first semiconductor die 804 includes a low-side semiconductor power device. In some examples, the second semiconductor die 806 includes a high-side semiconductor power device. The semiconductor package 800 includes a molding 812 that encapsulates at least a majority of the components of the semiconductor package 800. In some examples, the molding 812 encapsulates all of the components of the semiconductor package 800 except for a portion of the substrate 802 and the portions of the leads that extend from the molding 812.

The semiconductor package 800 includes a lead frame defining a plurality of leads such as a first lead 830-1 (e.g., the VIN lead), a second lead 830-2 (e.g., the SW lead), a third lead 830-3 (e.g., the VDDH lead), a fourth lead 830-4 (e.g., the BOOT lead), a fifth lead 830-5 (e.g., the PGND lead), a sixth lead 830-6 (e.g., the VDDL lead), a seventh lead 830-7 (e.g., the NC lead), an eighth lead 830-8 (e.g., the EN lead), a ninth lead 830-9 (e.g., the LIN lead), a tenth lead 830-10 (e.g., the HIN lead), an eleventh lead 830-11 (e.g., the DT lead), a twelfth lead 830-12 (e.g., the SGND lead), and a thirteenth lead 830-13 (e.g., the VDD lead). A portion of the leads may be considered a leadframe portion. In some examples, the semiconductor package 800 includes less than thirteen leads. In some examples, the semiconductor package 800 includes more than thirteen leads. The leads may define the external contacts, pins, or inputs/outputs (I/Os) for connecting the semiconductor package 800 to one or more external devices. In some examples, the semiconductor package 800 includes tie bar components as shown in the previous figures.

The substrate 802 includes a dielectric material. In some examples, the substrate 802 is a ceramic substrate. The substrate 802 includes a first surface 805 and a second surface 807 opposite to the first surface 805. In some examples, the first surface 805 and the second surface 807 are planar or substantially planar. In some examples, the first surface 805 is considered a top surface. In some examples, the first surface 805 is the surface that is exposed through the molding 812. In some examples, the second surface 807 is considered a bottom surface. In some examples, the second surface 807 is the surface that attaches to the leadframe portions and/or the first semiconductor die 804, the second semiconductor die 806, and third semiconductor die 808. The distance between the first surface 805 and the second surface 807 may define a thickness of the substrate 802. In some examples, the thickness of the substrate 802 is in a range of 15 to 100 mils. In some examples, the thickness of the substrate 802 is at least 15 mils. In some examples, the thickness of the substrate 802 is below 15 mils.

As shown in FIG. 8B, the first semiconductor die 804 and the second semiconductor die 806 are coupled to the second surface 807 of the substrate 802. Also, the third semiconductor die 808 is coupled to the second surface 807 of the substrate 802. In some examples, the first semiconductor die 804, the second semiconductor die 806, and the third semiconductor die 808 are coupled to the second surface 807 of the substrate 802 in a flip-chip configuration.

In some examples, three redistribution layers (e.g., metal traces) are coupled to (or formed on top of) the substrate 802, which include a top redistribution layer coupled to the first surface 805 of the substrate 802, a first bottom redistribution layer coupled to the second surface 807 of the substrate 802, and a second bottom redistribution layer coupled to the first bottom redistribution layer. In some examples, two redistribution layers are coupled to the substrate 802 (e.g., a top redistribution layer is omitted as shown in FIG. 8B). In some examples, one redistribution layer is coupled to the substrate 802 (e.g., the top redistribution layer and the second bottom redistribution layer are omitted). Each of the first semiconductor die 804, the second semiconductor die 806, and the third semiconductor die 808 are connected to the first bottom redistribution layer and/or the second bottom redistribution layer.

In further detail, a first metal trace (e.g., the top redistribution layer) (not shown in FIG. 8B) is coupled to the first surface 805 of the substrate 802. In some examples, the first metal trace is coupled directly to the first surface 805 of the substrate 802. In some examples, the first metal trace is a copper metal trace. At least a portion of the first metal trace may be exposed through the molding 812. In some examples, an entire outer surface of the first metal trace is exposed through the molding 812.

A second metal trace 816 (e.g., the first bottom redistribution layer) is coupled to the second surface 807 of the substrate 802. In some examples, the second metal trace 816 is coupled directly to the second surface 807 of the substrate 802. In some examples, the second metal trace 816 is a copper metal trace. In some examples, the third semiconductor die 808 is connected to the second metal trace 816. A third metal trace 818 (e.g. the second bottom redistribution layer) is coupled to portions of the second metal trace 816. In some examples, the third metal trace 818 is coupled directly to portions of the second metal trace 816. In some examples, the third metal trace 818 is a copper metal trace. In some examples, the first semiconductor die 804 is connected to the third metal trace 818. In some examples, the second semiconductor die 806 is connected to the third metal trace 818.

As shown in FIG. 8B, a leadframe portion 820 is connected to the third metal trace 818, and a lead frame portion 822 is connected to the third metal trace 818. In some examples, the leadframe portion 820 is a portion of the sixth lead 830-6 (e.g., the VDDL lead), and the leadframe portion 822 is a portion of the third lead 830-3 (e.g., the VDDH lead). The passive devices 810 are coupled to the leadframe (at a surface opposite to the substrate 802). For example, one passive device 810 may be coupled to the leadframe portion 820, and another passive device 810 may be coupled to the leadframe portion 822.

Figures 9A, 9B:
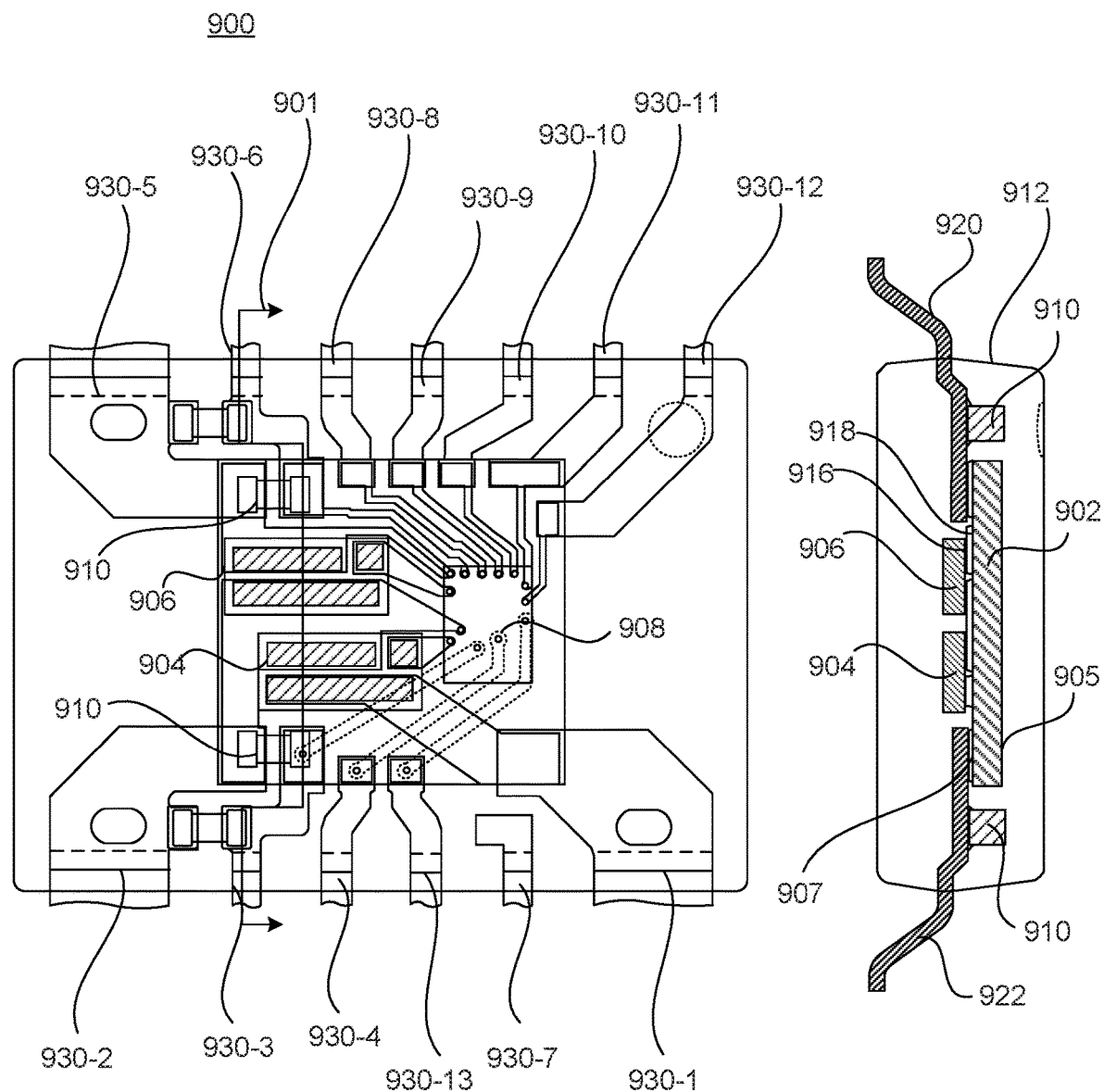
FIGS. 9A and 9B illustrate a semiconductor package according to another aspect.

FIGS. 9A and 9B illustrate a semiconductor package 900 with an exposed substrate configured as a hint sink according to aspect. The semiconductor package 900 may include leads on only two sides. The semiconductor package 900 may include any of the features discussed with reference to the previous figures. The semiconductor package 900 may be similar to the semiconductor packages previous discussed except that passive devices 910 are coupled to the leadframe adjacent and on the same side as a substrate 902.

FIG. 9A illustrates a perspective of the semiconductor package 900 according to an aspect. FIG. 9B illustrates a cross-section of the semiconductor package 900, taken along line 901, according to an aspect. The semiconductor package 900 includes the substrate 902, a first semiconductor die 904, a second semiconductor die 906, and a third semiconductor die 908. In some examples, the first semiconductor die 904 includes a low-side semiconductor power device. In some examples, the second semiconductor die 906 includes a high-side semiconductor power device. The semiconductor package 900 includes a molding 912 that encapsulates at least a majority of the components of the semiconductor package 900. In some examples, the molding 912 encapsulates all of the components of the semiconductor package 900 except for a portion of the substrate 902 and portions of the leads that extend from the molding 912.

The semiconductor package 900 includes a lead frame defining a plurality of leads such as a first lead 930-1 (e.g., the VIN lead), a second lead 930-2 (e.g., the SW lead), a third lead 930-3 (e.g., the VDDH lead), a fourth lead 930-4 (e.g., the BOOT lead), a fifth lead 930-5 (e.g., the PGND lead), a sixth lead 930-6 (e.g., the VDDL lead), a seventh lead 930-7 (e.g., the NC lead), an eighth lead 930-8 (e.g., the EN lead), a ninth lead 930-9 (e.g., the LIN lead), a tenth lead 930-10 (e.g., the HIN lead), an eleventh lead 930-11 (e.g., the DT lead), a twelfth lead 930-12 (e.g., the SGND lead), and a thirteenth lead 930-13 (e.g., the VDD lead). A portion of the leads may be considered a leadframe portion. In some examples, the semiconductor package 900 includes less than thirteen leads. In some examples, the semiconductor package 900 includes more than thirteen leads. The leads may define the external contacts, pins, or inputs/outputs (I/Os) for connecting the semiconductor package 900 to one or more external devices. In some examples, the semiconductor package 900 includes tie bar components as shown in the previous figures.

The substrate 902 includes a dielectric material. In some examples, the substrate 902 is a ceramic substrate. The substrate 902 includes a first surface 905 and a second surface 907 opposite to the first surface 905. In some examples, the first surface 905 and the second surface 907 are planar or substantially planar. In some examples, the first surface 905 is considered a top surface. In some examples, the first surface 905 is the surface that is exposed through the molding 912. In some examples, the second surface 907 is considered a bottom surface. In some examples, the second surface 907 is the surface that attaches to the leadframe portions and/or the first semiconductor die 904, the second semiconductor die 906, and third semiconductor die 908. The distance between the first surface 905 and the second surface 907 may define a thickness of the substrate 902. In some examples, the thickness of the substrate 902 is in a range of 15 to 100 mils. In some examples, the thickness of the substrate 902 is at least 15 mils. In some examples, the thickness of the substrate 902 is below 15 mils.

As shown in FIG. 9B, the first semiconductor die 904 and the second semiconductor die 906 are coupled to the second surface 907 of the substrate 902. Also, the third semiconductor die 908 is coupled to the second surface 907 of the substrate 902. In some examples, the first semiconductor die 904, the second semiconductor die 906, and the third semiconductor die 908 are coupled to the second surface 907 of the substrate 902 in a flip-chip configuration.

In some examples, three redistribution layers (e.g., metal traces) are coupled to (or formed on top of) the substrate 902, which include a top redistribution layer coupled to the first surface 905 of the substrate 902, a first bottom redistribution layer coupled to the second surface 907 of the substrate 902, and a second bottom redistribution layer coupled to the first bottom redistribution layer. In some examples, two redistribution layers are coupled to the substrate 902 (e.g., a top redistribution layer is omitted as shown in FIG. 9B). In some examples, one redistribution layer is coupled to the substrate 902 (e.g., the top redistribution layer and the second bottom redistribution layer are omitted). Each of the first semiconductor die 904, the second semiconductor die 906, and the third semiconductor die 908 are connected to the first bottom redistribution layer and/or the second bottom redistribution layer.

In further detail, a first metal trace (e.g., the top redistribution layer) (not shown in FIG. 9B) is coupled to the first surface 905 of the substrate 902. In some examples, the first metal trace is coupled directly to the first surface 905 of the substrate 902. In some examples, the first metal trace is a copper metal trace. At least a portion of the first metal trace may be exposed through the molding 912. In some examples, an entire outer surface of the first metal trace is exposed through the molding 912.

A second metal trace 916 (e.g., the first bottom redistribution layer) is coupled to the second surface 907 of the substrate 902. In some examples, the second metal trace 916 is coupled directly to the second surface 907 of the substrate 902. In some examples, the second metal trace 916 is a copper metal trace. In some examples, the third semiconductor die 908 is connected to the second metal trace 916. A third metal trace 918 (e.g. the second bottom redistribution layer) is coupled to portions of the second metal trace 916. In some examples, the third metal trace 918 is coupled directly to portions of the second metal trace 916. In some examples, the third metal trace 918 is a copper metal trace. In some examples, the first semiconductor die 904 is connected to the third metal trace 918. In some examples, the second semiconductor die 906 is connected to the third metal trace 918.

As shown in FIG. 9B, a leadframe portion 920 is connected to the third metal trace 918, and a lead frame portion 922 is connected to the third metal trace 918. In some examples, the leadframe portion 920 is a portion of the sixth lead 930-6 (e.g., VDDL lead), and the leadframe portion 922 is a portion of the third lead 930-3 (e.g., VDDH lead). The passive devices 910 are coupled to the leadframe (e.g., bonded on top of the leadframe adjacent and on the same side as the substrate 902. For example, one passive device 910 may be coupled to the leadframe portion 920, and another passive device 910 may be coupled to the leadframe portion 922.

FIGS. 10A and 10B illustrate a semiconductor package 1000 with an exposed substrate surface configured as a hint sink according to aspect. The semiconductor package 1000 may include leads on only two sides. The semiconductor package 1000 may include any of the features discussed with reference to the previous figures. The semiconductor package 1000 may be similar to the semiconductor package 800 of FIGS. 8A and 8B except that bond wires 1060 are used to connect one or more portions of a third semiconductor die 1008 to one or more leadframe portions. For example, instead of rerouting the redistribution layer to the other side of the substrate 1002, the semiconductor package 100 may use one or more bond wires 1060 to address potential I/O conflicts.

FIG. 10A illustrates a perspective of the semiconductor package 1000 according to an aspect. FIG. 10B illustrates a cross-section of the semiconductor package 1000, taken along line 1001, according to an aspect. FIG. 10C illustrates a cross-section of the semiconductor package 100, taken along line 1003, according to an aspect.

The semiconductor package 1000 includes the substrate 1002, a first semiconductor die 1004, a second semiconductor die 1006, and the third semiconductor die 1008. In some examples, the first semiconductor die 1004 includes a low-side semiconductor power device. In some examples, the second semiconductor die 1006 includes a high-side semiconductor power device. The semiconductor package 1000 includes a molding 1012 that encapsulates at least a majority of the components of the semiconductor package 1000. In some examples, the molding 1012 encapsulates all of the components of the semiconductor package 1000 except for a portion of the substrate 1002 and portions of the leads that extend from the molding 1012.

The semiconductor package 1000 includes a lead frame defining a plurality of leads such as a first lead 1030-1 (e.g., the VIN lead), a second lead 1030-2 (e.g., the SW lead), a third lead 1030-3 (e.g., the VDDH lead), a fourth lead 1030-4 (e.g., the BOOT lead), a fifth lead 1030-5 (e.g., the PGND lead), a sixth lead 1030-6 (e.g., the VDDL lead), a seventh lead 1030-7 (e.g., the NC lead), an eighth lead 1030-8 (e.g., the EN lead), a ninth lead 1030-9 (e.g., the LIN lead), a tenth lead 1030-10 (e.g., the HIN lead), an eleventh lead 1030-11 (e.g., the DT lead), a twelfth lead 1030-12 (e.g., the SGND lead), and a thirteenth lead 1030-13 (e.g., the VDD lead). A portion of the leads may be considered a leadframe portion. In some examples, the semiconductor package 1000 includes less than thirteen leads. In some examples, the semiconductor package 1000 includes more than thirteen leads. The leads may define the external contacts, pins, or inputs/outputs (I/Os) for connecting the semiconductor package 1000 to one or more external devices. In some examples, the semiconductor package 1000 includes tie bar components as shown in the previous figures.

The substrate 1002 includes a dielectric material. In some examples, the substrate 1002 is a ceramic substrate. The substrate 1002 includes a first surface 1005 and a second surface 1007 opposite to the first surface 1005. In some examples, the first surface 1005 and the second surface 1007 are planar or substantially planar. In some examples, the first surface 1005 is considered a top surface. In some examples, the first surface 1005 is the surface that is exposed through the molding 1012. In some examples, the second surface 1007 is considered a bottom surface. In some examples, the second surface 1007 is the surface that attaches to the leadframe portions and/or the first semiconductor die 1004, the second semiconductor die 1006, and third semiconductor die 1008. The distance between the first surface 1005 and the second surface 1007 may define a thickness of the substrate 1002. In some examples, the thickness of the substrate 1002 is in a range of 15 to 100 mils. In some examples, the thickness of the substrate 1002 is at least 15 mils. In some examples, the thickness of the substrate 1002 is below 15 mils.

As shown in FIG. 10B, the first semiconductor die 1004 and the second semiconductor die 1006 are coupled to the second surface 1007 of the substrate 1002. Also, as shown in FIG. 10C, the third semiconductor die 1008 is coupled to the second surface 1007 of the substrate 1002. In some examples, the first semiconductor die 1004, the second semiconductor die 1006, and the third semiconductor die 1008 are coupled to the second surface 1007 of the substrate 1002 in a flip-chip configuration.

As shown in FIG. 10B, a leadframe portion 1020 is connected to the substrate 1002, and a lead frame portion 1022 is connected to the substrate 1002. In some examples, the leadframe portion 1020 is a portion of the sixth lead 1030-6 (e.g., VDDL lead), and the leadframe portion 1022 is a portion of the third lead 1030-3 (e.g., VDDH lead). The passive devices 1010 are coupled to the leadframe (at a surface opposite to the substrate 1002). For example, one passive device 1010 may be coupled to the leadframe portion 1020, and another passive device 1010 may be coupled to the leadframe portion 1022. As shown in FIG. 10C, a leadframe portion 1040 and a leadframe portion 1042 are coupled to the substrate, and a bond wire 1060 may be connected to the leadframe portion 1042 and the substrate 1002.

In some examples, three redistribution layers (e.g., metal traces) are coupled to (or formed on top of) the substrate 1002, which include a top redistribution layer coupled to the first surface 1005 of the substrate 1002, a first bottom redistribution layer coupled to the second surface 1007 of the substrate 1002, and a second bottom redistribution layer coupled to the first bottom redistribution layer. In some examples, two redistribution layers are coupled to the substrate 1002 (e.g., a top redistribution layer is omitted as shown in FIG. 10B). In some examples, one redistribution layer is coupled to the substrate 1002 (e.g., the top redistribution layer and the second bottom redistribution layer are omitted). Each of the first semiconductor die 1004, the second semiconductor die 1006, and the third semiconductor die 1008 are connected to the first bottom redistribution layer and/or the second bottom redistribution layer.

FIGS. 11 through 18 illustrate dual cooling techniques for any of the previous discussed semiconductor packages according to an aspect. The semiconductor packages of FIGS. 11 through 18 may include any of the features discussed with reference to the previous figures.

FIG. 11 illustrates a semiconductor package 1100 with an exposed substrate configured as a hint sink according to aspect. The semiconductor package 1100 includes a substrate 1102 having a first surface 1105 and a second surface 1107. The semiconductor package 1100 includes a molding 1112 configured to encapsulate all of the components of the semiconductor package 1100 except for a portion of the substrate 1102 (e.g., the top surface of the substrate 1102) and the portions of the leads that extend from the molding 1112. Referring to FIG. 11, the top surface of the molding 1112 is grinded down in order to expose the first surface 1105 of the substrate 1102 (e.g. the bare ceramic). In some examples, the entire top surface of the substrate 1102 is exposed through the molding 1112.

The semiconductor package 1100 includes a first semiconductor die 1104 (e.g., a low-side semiconductor power die) and a second semiconductor die 1106 (e.g., a high-side semiconductor power die). In addition, the semiconductor package 1100 may include a third semiconductor die (e.g., a driver IC die) as discussed with reference to the previous figures. In addition, the semiconductor package 1100 includes passive devices 1110 (e.g., capacitors). The first semiconductor die 1104 and the second semiconductor die 1106 may be coupled to the substrate 1102 via one or more redistribution layers. In some examples, the first surface 1105 of the substrate 1102 does not have a redistribution layer (e.g., the bare ceramic is exposed).

Referring to FIG. 11, a leadframe portion 1140, the first semiconductor die 1104, the second semiconductor die 1106, and a leadframe portion 1142 may be coupled to the second surface 1107 of the substrate 1102. The leadframe portion 1140 and the leadframe portion 1142 may be any portions of the leads discussed with reference to the previous figures. The passive devices 1110 may be coupled to the leadframe frame on a side that is opposite to the substrate 1102. For example, one passive device 1110 may be coupled to the leadframe portion 1140 (at a location opposite to the substrate 1102) and another passive device 1110 may be coupled to the leadframe portion 1142 (at a location opposite to the substrate 1102).

FIG. 12 illustrates a semiconductor package 1200 with an exposed substrate configured as a hint sink according to aspect. The semiconductor package 1200 includes a substrate 1202 having a first surface 1205 and a second surface 1207. The semiconductor package 1200 includes a metal trace 1214 (e.g., a top redistribution layer) coupled to the first surface 1205. The semiconductor package 1200 includes a molding 1212 configured to encapsulate all of the components of the semiconductor package 1200 except for a portion of the substrate 1202 (e.g., the top surface of the substrate 1202) and the portions of the leads that extend from the molding 1212. Referring to FIG. 12, the top surface of the molding 1212 is grinded down in order to expose the metal trace 1214 of the substrate 1202. In some examples, the entire metal trace 1214 is exposed through the molding 1212. In some examples, the metal trace 1214 is soldered plated.

The semiconductor package 1200 includes a first semiconductor die 1204 (e.g., a low-side semiconductor power die) and a second semiconductor die 1206 (e.g., a high-side semiconductor power die). In addition, the semiconductor package 1200 may include a third semiconductor die (e.g., a driver IC die) as discussed with reference to the previous figures. In addition, the semiconductor package 1200 includes passive devices 1210 (e.g., capacitors). The first semiconductor die 1204 and the second semiconductor die 1206 may be coupled to the substrate 1202 via one or more redistribution layers.

Referring to FIG. 12, a leadframe portion 1240, the first semiconductor die 1204, the second semiconductor die 1206, and a leadframe portion 1242 may be coupled to the second surface 1207 of the substrate 1202. The leadframe portion 1240 and the leadframe portion 1242 may be any portions of the leads discussed with reference to the previous figures. The passive devices 1210 may be coupled to the leadframe frame on a side that is opposite to the substrate 1202. For example, one passive device 1210 may be coupled to the leadframe portion 1240 (at a location opposite to the substrate 1202) and another passive device 1210 may be coupled to the leadframe portion 1242 (at a location opposite to the substrate 1202).

FIG. 13 illustrates a semiconductor package 1300 with an exposed substrate configured as a hint sink according to aspect. The semiconductor package 1300 includes a substrate 1302 having a first surface 1305 and a second surface 1307. The semiconductor package 1300 includes a molding 1312 configured to encapsulate all of the components of the semiconductor package 1300 except for a portion of the substrate 1302 (e.g., the top surface of the substrate 1302) and the portions of the leads that extend from the molding 1312. Referring to FIG. 13, the top surface of the molding 1312 is grinded down in order to expose the first surface 1305 of the substrate 1302. In some examples, the entire top surface of the substrate 1302 is exposed through the molding 1312.

The semiconductor package 1300 includes a first semiconductor die 1304 (e.g., a low-side semiconductor power die) and a second semiconductor die 1306 (e.g., a high-side semiconductor power die). In addition, the semiconductor package 1300 may include a third semiconductor die (e.g., a driver IC die) as discussed with reference to the previous figures. In addition, the semiconductor package 1300 includes passive devices 1310 (e.g., capacitors). The passive devices 1310 may be coupled to the leadframe on the same side as the substrate 1302. The first semiconductor die 1304 and the second semiconductor die 1306 may be coupled to the substrate 1302 via one or more redistribution layers. In some examples, the first surface 1305 of the substrate 1302 does not have a redistribution layer (e.g., the bare ceramic is exposed).

Referring to FIG. 13, a leadframe portion 1340, the first semiconductor die 1304, the second semiconductor die 1306, and a leadframe portion 1342 may be coupled to the second surface 1307 of the substrate 1302. The leadframe portion 1340 and the leadframe portion 1342 may be any portions of the leads discussed with reference to the previous figures. The passive devices 1310 may be coupled to the leadframe frame on the same side as the substrate 1302. For example, one passive device 1310 may be coupled to the leadframe portion 1340 (at a location on the same side as the substrate 1302) and another passive device 1310 may be coupled to the leadframe portion 1342 (at a location on the same side as the substrate 1302).

FIG. 14 illustrates a semiconductor package 1400 with an exposed substrate configured as a hint sink according to aspect. The semiconductor package 1400 includes a substrate 1402 having a first surface 1405 and a second surface 1407. The semiconductor package 1400 includes a metal trace 1414 (e.g., a top redistribution layer) coupled to the first surface 1405. In addition, the semiconductor package 1400 includes a metal spacer 1415 coupled to the metal trace 1414. In some examples, the metal spacer 1415 is a metal heat slug. The semiconductor package 1400 includes a molding 1412 configured to encapsulate all of the components of the semiconductor package 1400 except for a portion of the substrate 1402 (e.g., the top surface of the substrate 1402) and the portions of the leads that extend from the molding 1412. Referring to FIG. 14, the top portion of the molding 1412 is grinded down in order to expose the metal spacer 1415 of the substrate 1402. The metal spacer 1415 may assist with preventing from accidently grinding down the top surfaces of the passive devices 1410 (or other larger components includes of the package).

The semiconductor package 1400 includes a first semiconductor die 1404 (e.g., a low-side semiconductor power die) and a second semiconductor die 1406 (e.g., a high-side semiconductor power die). In addition, the semiconductor package 1400 may include a third semiconductor die (e.g., a driver IC die) as discussed with reference to the previous figures. In addition, the semiconductor package 1400 includes the passive devices 1410. The first semiconductor die 1404 and the second semiconductor die 1406 may be coupled to the substrate 1402 via one or more redistribution layers.

Referring to FIG. 14, a leadframe portion 1440, the first semiconductor die 1404, the second semiconductor die 1406, and a leadframe portion 1442 may be coupled to the second surface 1407 of the substrate 1402. The leadframe portion 1440 and the leadframe portion 1442 may be any portions of the leads discussed with reference to the previous figures. The passive devices 1410 may be coupled to the leadframe frame on the same side as the substrate 1402. For example, one passive device 1410 may be coupled to the leadframe portion 1440 (at a location on the same side as the substrate 1402) and another passive device 1410 may be coupled to the leadframe portion 1442 (at a location on the same side as the substrate).

FIG. 15 illustrates a semiconductor package 1500 with an exposed substrate configured as a hint sink according to aspect. The semiconductor package 1500 includes a substrate 1502 having a first surface 1505 and a second surface 1507. The semiconductor package 1500 includes a molding 1512 configured to encapsulate all of the components of the semiconductor package 1500 except for a portion of the substrate 1502 (e.g., the top surface of the substrate 1502). In FIG. 15, a recessed in formed in the molding 1512 in order to expose the first surface 1505. In some examples, a portion of the first surface 1505 is exposed through the molding 1512, and a portion of the first surface 1505 is covered by the molding 1512. In some examples, the first surface 1505 is disposed below the top surface of the molding 1512.

The semiconductor package 1500 includes a first semiconductor die 1504 (e.g., a low-side semiconductor power die) and a second semiconductor die 1506 (e.g., a high-side semiconductor power die). In addition, the semiconductor package 1500 may include a third semiconductor die (e.g., a driver IC die) as discussed with reference to the previous figures. In addition, the semiconductor package 1500 includes passive devices 1510. The first semiconductor die 1504 and the second semiconductor die 1506 may be coupled to the substrate 1502 via one or more redistribution layers. In some examples, the first surface 1505 of the substrate 1502 does not have a redistribution layer (e.g., the bare ceramic is exposed).

Referring to FIG. 15, a leadframe portion 1540, the first semiconductor die 1504, the second semiconductor die 1506, and a leadframe portion 1542 may be coupled to the second surface 1507 of the substrate 1502. The leadframe portion 1540 and the leadframe portion 1542 may be any portions of the leads discussed with reference to the previous figures. The passive devices 1510 may be coupled to the leadframe frame opposite to the substrate 1502. For example, one passive device 1510 may be coupled to the leadframe portion 1540 (at a location opposite to the substrate 1502) and another passive device 1510 may be coupled to the leadframe portion 1542 (at a location opposite to the substrate 1502).

FIG. 16 illustrates a semiconductor package 1600 with an exposed substrate configured as a hint sink according to aspect. The semiconductor package 1600 includes a substrate 1602 having a first surface 1605 and a second surface 1607. The semiconductor package 1600 includes a metal trace 1614 (e.g., a top redistribution layer) coupled to the first surface 1605. In some examples, the metal trace 1614 is solder plated. The semiconductor package 1600 includes a molding 1612 configured to encapsulate all of the components of the semiconductor package 1600 except for a portion of the substrate 1602 (e.g., the top surface of the substrate 1602). In FIG. 16, a recessed in formed in the molding 1612 in order to expose the metal trace 1614. In some examples, a portion of the metal trace 1614 is exposed through the molding 1612, and a portion of the metal trace 1614 is covered by the molding 1612. In some examples, the metal trace 1614 is disposed below the top surface of the molding 1612.

The semiconductor package 1600 includes a first semiconductor die 1604 (e.g., a low-side semiconductor power die) and a second semiconductor die 1606 (e.g., a high-side semiconductor power die). In addition, the semiconductor package 1600 may include a third semiconductor die (e.g., a driver IC die) as discussed with reference to the previous figures. In addition, the semiconductor package 1600 includes passive devices 1610. The first semiconductor die 1604 and the second semiconductor die 1606 may be coupled to the substrate 1602 via one or more redistribution layers.

Referring to FIG. 16, a leadframe portion 1640, the first semiconductor die 1604, the second semiconductor die 1606, and a leadframe portion 1642 may be coupled to the second surface 1607 of the substrate 1602. The leadframe portion 1640 and the leadframe portion 1642 may be any portions of the leads discussed with reference to the previous figures. The passive devices 1610 may be coupled to the leadframe frame opposite to the substrate 1602. For example, one passive device 1610 may be coupled to the leadframe portion 1640 (at a location opposite to the substrate 1602) and another passive device 1610 may be coupled to the leadframe portion 1642 (at a location opposite to the substrate 1602).

FIG. 17 illustrates a semiconductor package 1700 with an exposed substrate configured as a hint sink according to aspect. The semiconductor package 1700 includes a substrate 1702 having a first surface 1705 and a second surface 1707. The semiconductor package 1700 includes a molding 1712 configured to encapsulate all of the components of the semiconductor package 1700 except for a portion of the substrate 1702 (e.g., the top surface of the substrate 1702). In FIG. 17, a recessed in formed in the molding 1712 in order to expose the first surface 1705. In some examples, a portion of the first surface 1705 is exposed through the molding 1712, and a portion of the first surface 1705 is covered by the molding 1712. In some examples, the first surface 1705 is disposed below the top surface of the molding 1712.

The semiconductor package 1700 includes a first semiconductor die 1704 (e.g., a low-side semiconductor power die) and a second semiconductor die 1706 (e.g., a high-side semiconductor power die). In addition, the semiconductor package 1700 may include a third semiconductor die (e.g., a driver IC die) as discussed with reference to the previous figures. In addition, the semiconductor package 1700 includes passive devices 1710. The passive devices 1710 may be coupled to the leadframe on the same side as the substrate 1702. The first semiconductor die 1704 and the second semiconductor die 1706 may be coupled to the substrate 1702 via one or more redistribution layers. In some examples, the first surface 1705 of the substrate 1702 does not have a redistribution layer (e.g., the bare ceramic is exposed).

Referring to FIG. 17, a leadframe portion 1740, the first semiconductor die 1704, the second semiconductor die 1706, and a leadframe portion 1742 may be coupled to the second surface 1707 of the substrate 1702. The leadframe portion 1740 and the leadframe portion 1742 may be any portions of the leads discussed with reference to the previous figures. The passive devices 1710 may be coupled to the leadframe frame on the same side as the substrate 1702. For example, one passive device 1710 may be coupled to the leadframe portion 1740 (at a location on the same side as the substrate 1702) and another passive device 1710 may be coupled to the leadframe portion 1742 (at a location on the same side as the substrate 1702).

FIG. 18 illustrates a semiconductor package 1800 with an exposed substrate configured as a hint sink according to aspect. The semiconductor package 1800 includes a substrate 1802 having a first surface 1805 and a second surface 1807. The semiconductor package 1800 includes a metal trace 1814 (e.g., a top redistribution layer) coupled to the first surface 1805. In some examples, the metal trace 1814 is solder plated. The semiconductor package 1800 includes a molding 1812 configured to encapsulate all of the components of the semiconductor package 1800 except for a portion of the substrate 1802 (e.g., the top surface of the substrate 1802). In FIG. 18, a recessed in formed in the molding 1812 in order to expose the metal trace 1814. In some examples, a portion of the metal trace 1814 is exposed through the molding 1812, and a portion of the metal trace 1814 is covered by the molding 1812. In some examples, the metal trace 1814 is disposed below the top surface of the molding 1812.

The semiconductor package 1800 includes a first semiconductor die 1804 (e.g., a low-side semiconductor power die) and a second semiconductor die 1806 (e.g., a high-side semiconductor power die). In addition, the semiconductor package 1800 may include a third semiconductor die (e.g., a driver IC die) as discussed with reference to the previous figures. In addition, the semiconductor package 1800 includes passive devices 1810. The first semiconductor die 1804 and the second semiconductor die 1806 may be coupled to the substrate 1802 via one or more redistribution layers.

Referring to FIG. 18, a leadframe portion 1840, the first semiconductor die 1804, the second semiconductor die 1806, and a leadframe portion 1842 may be coupled to the second surface 1807 of the substrate 1802. The leadframe portion 1840 and the leadframe portion 1842 may be any portions of the leads discussed with reference to the previous figures. The passive devices 1810 may be coupled to the leadframe frame on the same side as the substrate 1802. For example, one passive device 1810 may be coupled to the leadframe portion 1840 (at a location on the same side as the substrate 1802) and another passive device 1810 may be coupled to the leadframe portion 1842 (at a location on the same side as the substrate 1802).

It will be understood that, in the foregoing description, when an element is referred to as being connected to, electrically connected to, coupled to, or electrically coupled to another element, it may be directly connected or coupled to the other element, or one or more intervening elements may be present. In contrast, when an element is referred to as being directly connected to or directly coupled to another element, there are no intervening elements. Although the terms directly connected to, or directly coupled to may not be used throughout the detailed description, elements that are shown as being directly connected or directly coupled can be referred to as such. The claims of the application, if any, may be amended to recite exemplary relationships described in the specification or shown in the figures. Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A semiconductor package comprising:
   a substrate having a first surface and a second surface opposite to the first surface, the substrate including a central portion;
   a semiconductor die coupled to the central portion and to the second surface of the substrate; and
   a molding encapsulating the semiconductor die and a majority of the substrate, the molding covering a first portion of the first surface, a second portion of the first surface on the central portion being exposed through the molding such that the substrate is configured to function as a heat sink.

2. The semiconductor package of claim 1, further comprising:
   a metal trace coupled to the central portion and to the first surface of the substrate, at least a portion of the metal trace being exposed through the molding.

3. The semiconductor package of claim 1, wherein the substrate is a dielectric substrate, the dielectric substrate including a conductive via extending between the first surface and the second surface.

4. The semiconductor package of claim 1, wherein the substrate includes a conductive via, the semiconductor package further comprising:
   a first leadframe portion coupled to the second surface of the substrate, the conductive via being connected to the first leadframe portion; and
   a second leadframe portion coupled to the second surface of the substrate, the semiconductor die being disposed between the first leadframe portion and the second leadframe portion.

5. The semiconductor package of claim 1, wherein the semiconductor die is a first semiconductor die, the semiconductor package further comprising:
   a second semiconductor die coupled to the second surface of the substrate.

6. The semiconductor package of claim 5, further comprising:
   a third semiconductor die coupled to the second surface of the substrate.

7. The semiconductor package of claim 1, wherein the substrate includes a conductive via, the semiconductor package further comprising:
   a redistribution layer coupled to the conductive via and to the second surface of the substrate, the semiconductor die being coupled to the redistribution layer; and
   a leadframe portion coupled to the redistribution layer.

8. The semiconductor package of claim 7, further comprising:
   a passive device coupled to the redistribution layer.

9. The semiconductor package of claim 1, further comprising:
   a leadframe portion coupled to the substrate; and
   a passive device coupled to the leadframe portion.

10. A semiconductor package comprising:
- a substrate having a first surface and a second surface opposite to the first surface, the substrate having a dielectric material, the substrate including a conductive via;
- a redistribution layer coupled to the conductive via and to the second surface of the substrate;
- a leadframe portion coupled to the redistribution layer;
- a metal trace coupled to the first surface of the substrate and to the conductive via;
- a semiconductor die coupled to the redistribution layer; and
- a molding encapsulating the semiconductor die and a majority of the substrate, the molding covering a first portion of the first surface, a second portion of the first surface and at least a portion of the metal trace being exposed through the molding such that the substrate is configured to function as a heat sink.

11. The semiconductor package of claim 10, wherein the metal trace extends along a majority of a length of the first surface of the substrate.

12. The semiconductor package of claim 10, wherein the metal trace includes a linear portion.

13. The semiconductor package of claim 10, further comprising:
- a capacitor coupled to the leadframe portion or the substrate.

14. The semiconductor package of claim 10, wherein the semiconductor die is a first semiconductor die, the semiconductor package further comprising:
- a second semiconductor die coupled to the redistribution layer; and
- a third semiconductor die coupled to the redistribution layer.

15. The semiconductor package of claim 14, wherein the first semiconductor die is a low-side semiconductor die, the second semiconductor die is a high-side semiconductor die, and the third semiconductor die is a driver integrated circuit (IC) die.

16. A semiconductor package comprising:
- a substrate having a first surface and a second surface opposite to the first surface, the substrate having a conductive via extending between the first surface and the second surface;
- a redistribution layer coupled to the conductive via and to the second surface of the substrate;
- a leadframe portion coupled to the redistribution layer;
- a metal trace coupled to the first surface of the substrate and to the conductive via;
- a first semiconductor die coupled to the redistribution layer;
- a second semiconductor die coupled to the redistribution layer; and
- a molding encapsulating the first semiconductor die, the second semiconductor die, and a majority of the substrate, the molding covering a first portion of the first surface, a second portion of the first surface and at least a portion of the metal trace being exposed through the molding such that the substrate is configured to function as a heat sink.

17. The semiconductor package of claim 16, further comprising:
- a first passive device coupled to the redistribution layer; and
- a second passive device coupled to the redistribution layer.

18. The semiconductor package of claim 16, further comprising:
- a driver integrated circuit die coupled to the redistribution layer.

* * * * *